(12) United States Patent
Iwai

(10) Patent No.: US 11,480,838 B2
(45) Date of Patent: Oct. 25, 2022

(54) DISPLAY DEVICE

(71) Applicant: Japan Display Inc., Tokyo (JP)

(72) Inventor: Youhei Iwai, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/412,344

(22) Filed: Aug. 26, 2021

(65) Prior Publication Data

US 2021/0382363 A1 Dec. 9, 2021

Related U.S. Application Data

(63) Continuation of application No. PCT/JP2020/015178, filed on Apr. 2, 2020.

(30) Foreign Application Priority Data

Apr. 16, 2019 (JP) .............................. JP2019-077615

(51) Int. Cl.
  *G02F 1/1368* (2006.01)
  *G02F 1/1362* (2006.01)
  *H01L 27/32* (2006.01)

(52) U.S. Cl.
  CPC ...... *G02F 1/136286* (2013.01); *G02F 1/1368* (2013.01); *H01L 27/3276* (2013.01)

(58) Field of Classification Search
  CPC ............. G02F 1/136286; G02F 1/1368; H01L 27/3276
  See application file for complete search history.

(56) References Cited

U.S. PATENT DOCUMENTS

| | | | | |
|---|---|---|---|---|
| 5,099,343 | A | * 3/1992 | Margerum | ............ G02F 1/1334 362/613 |
| 8,390,762 | B2 | * 3/2013 | Kim | .................... G07F 17/3211 349/63 |
| 2010/0109494 | A1 | * 5/2010 | Jung | .................... A47L 15/4251 312/228 |
| 2013/0271696 | A1 | 10/2013 | Dunn | |

FOREIGN PATENT DOCUMENTS

JP         2015-505374 A      2/2015

OTHER PUBLICATIONS

International Search Report dated Jun. 16, 2020 for the PCT Application No. PCT/JP2020/015178, with English machine translation.

* cited by examiner

*Primary Examiner* — James A Dudek
(74) *Attorney, Agent, or Firm* — Michael Best & Friedlich LLP

(57) ABSTRACT

The purpose of the invention is to realize the display whose screen is seen as floating in the transparent medium. The present invention, for example, takes a following structure. A display device including a transparent display device being fixed in a pedestal including: the transparent display device having a display area and a first transparent medium, the first transparent medium existing between the display area and the pedestal, in which scanning lines and video signal lines are formed in the display area, scanning line lead wires and video signal lead wires are formed in the first transparent medium, and provided an area of the display area is S1, and an area of the first transparent medium is S2, S2/S1 is 0.5 or more.

20 Claims, 33 Drawing Sheets

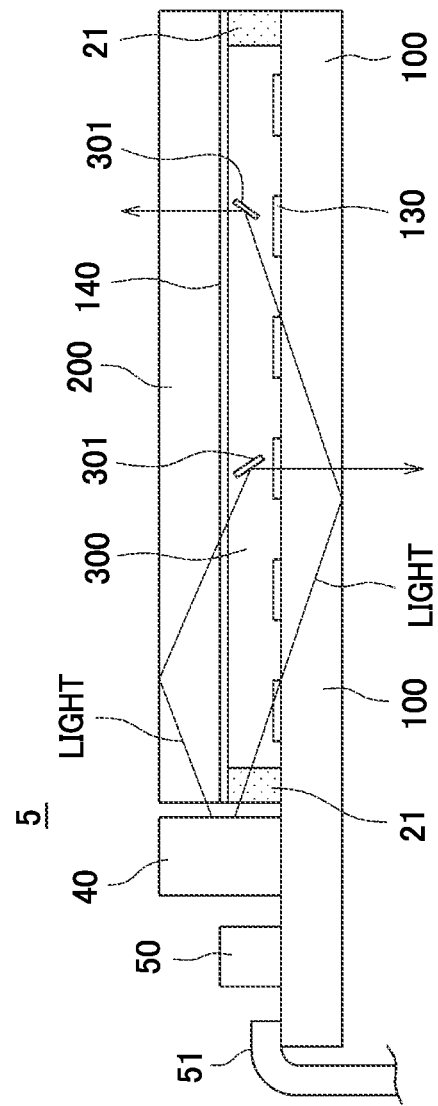

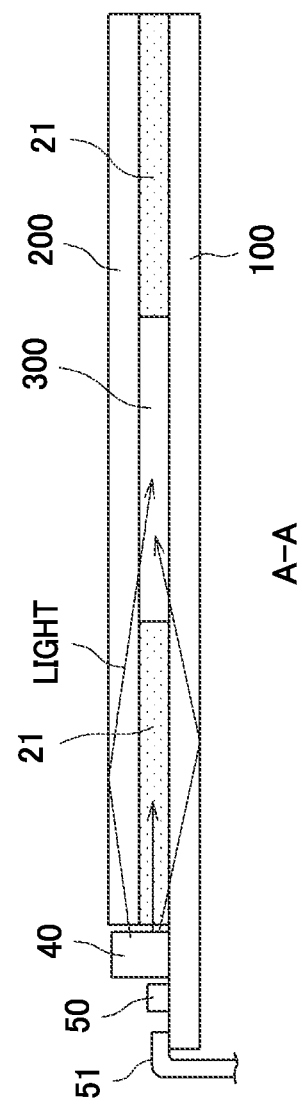

B-B

C-C

FIG. 8
FIG. 9
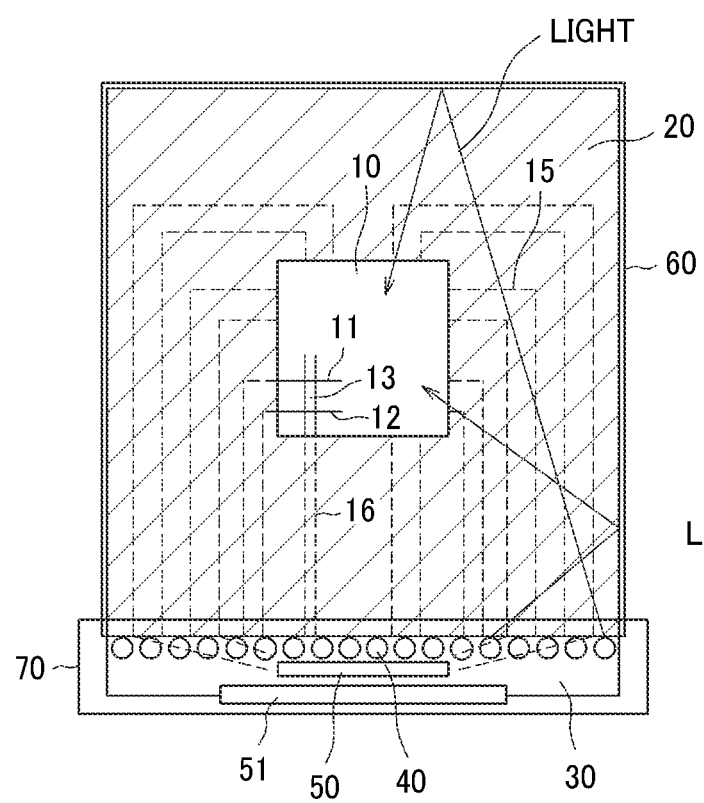
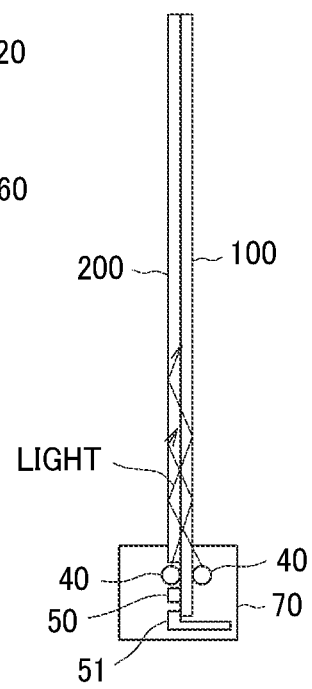

FIG. 12A
FIG. 12B
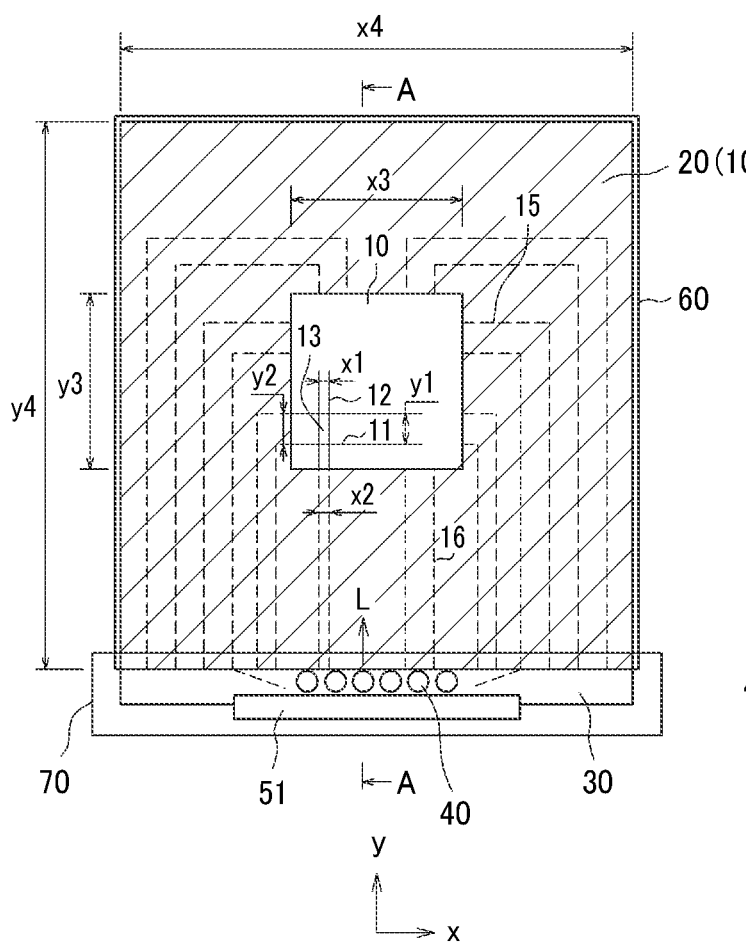
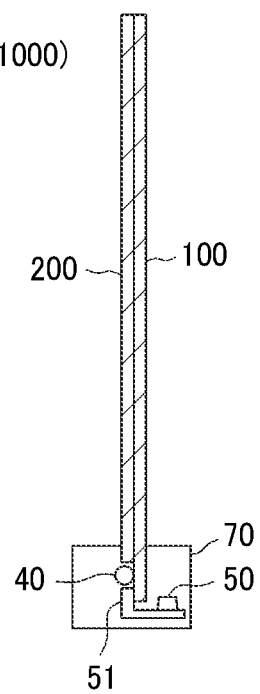

FIG. 18
FIG. 19
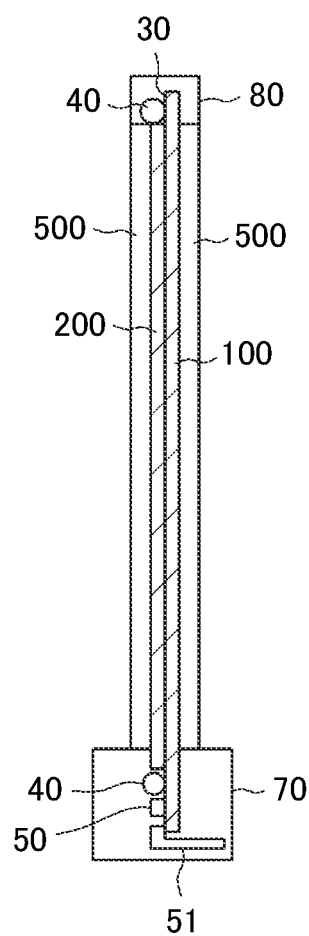
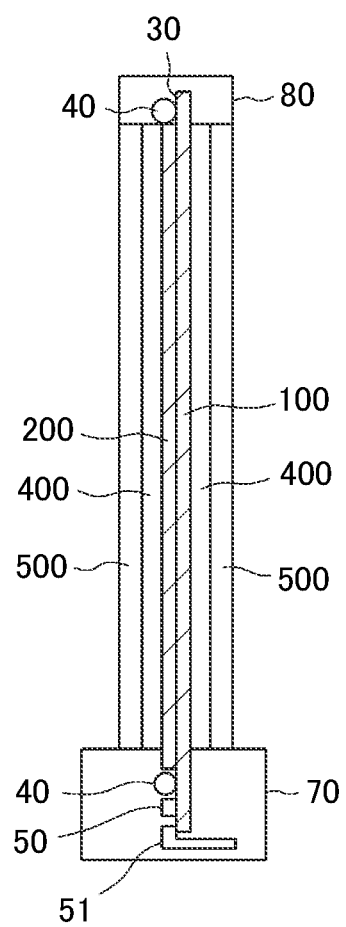

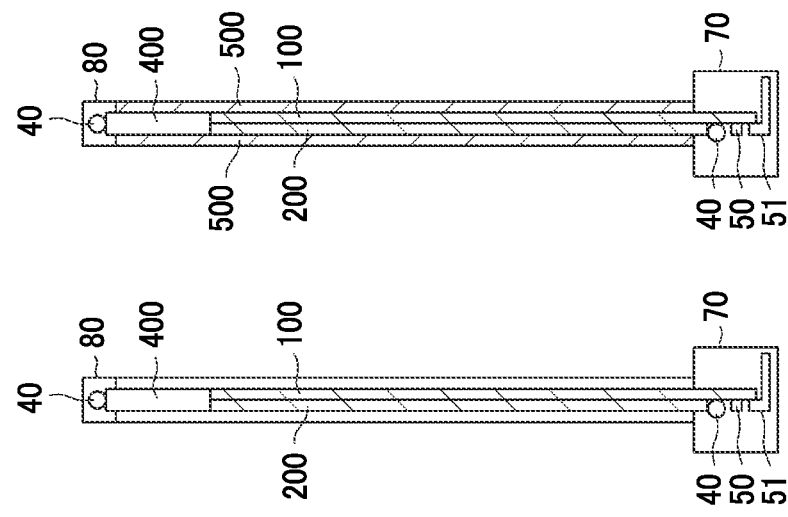
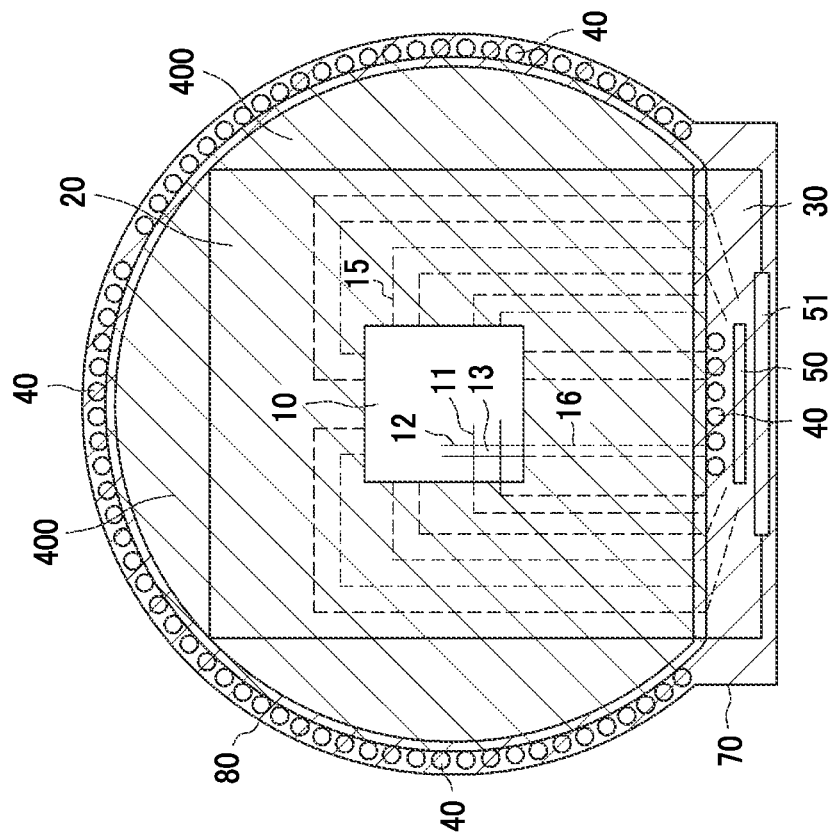

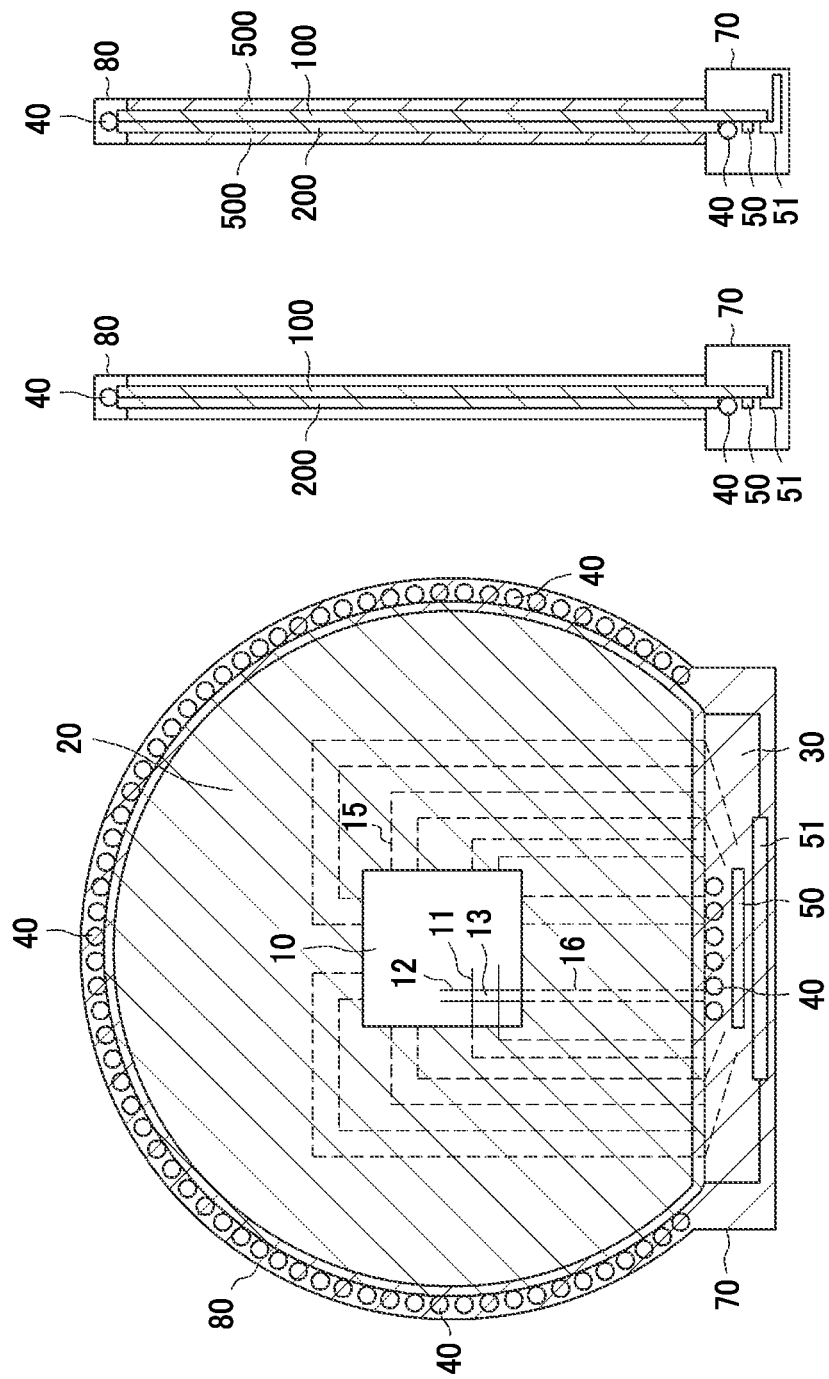

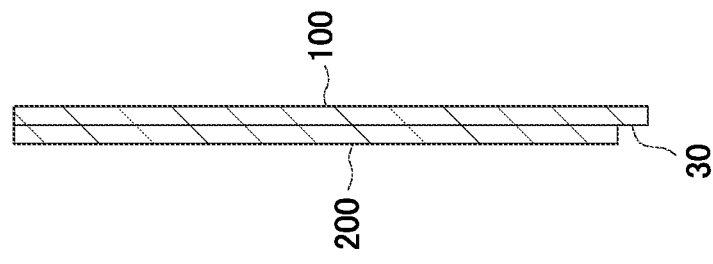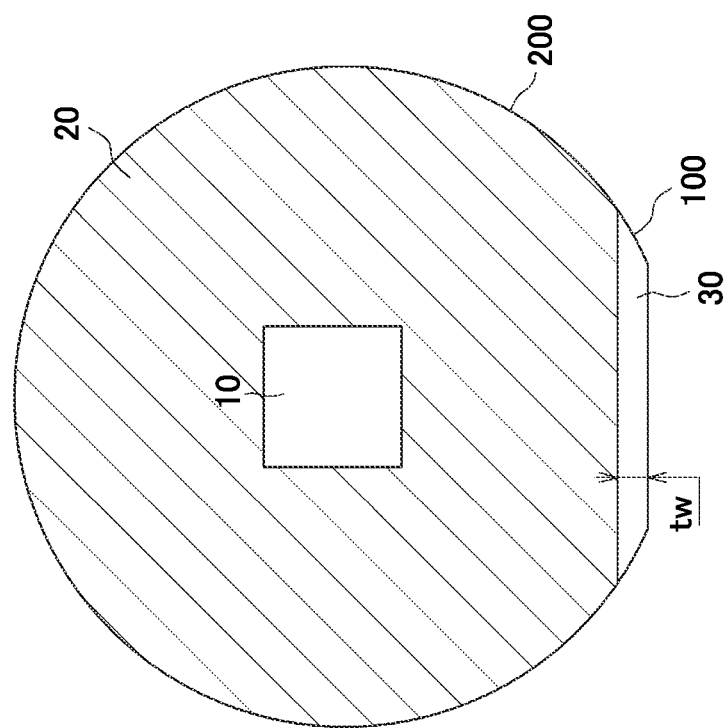

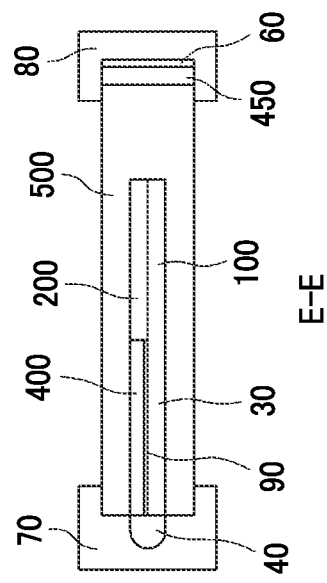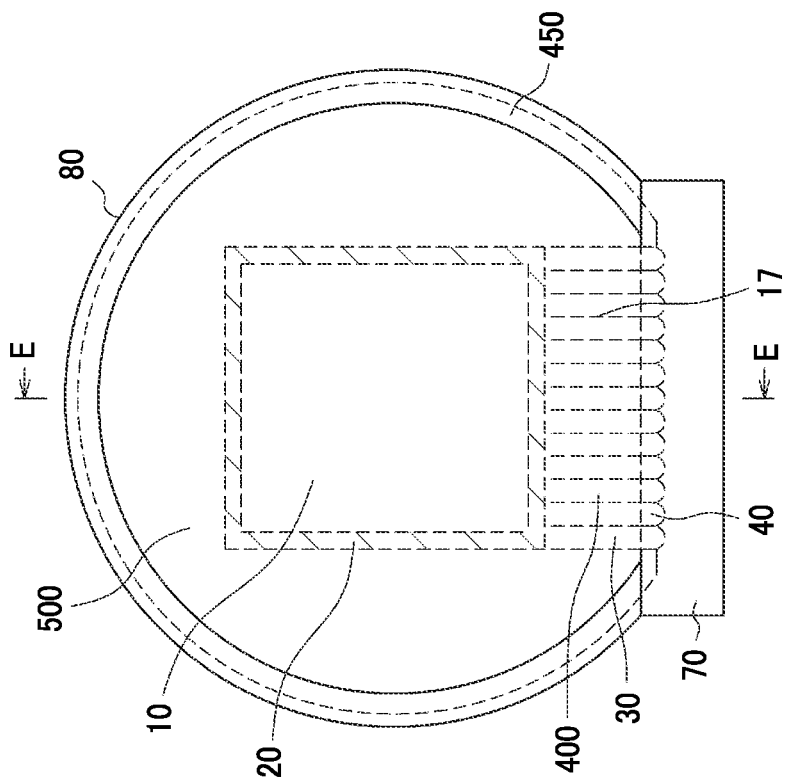

FIG. 30A
FIG. 30B
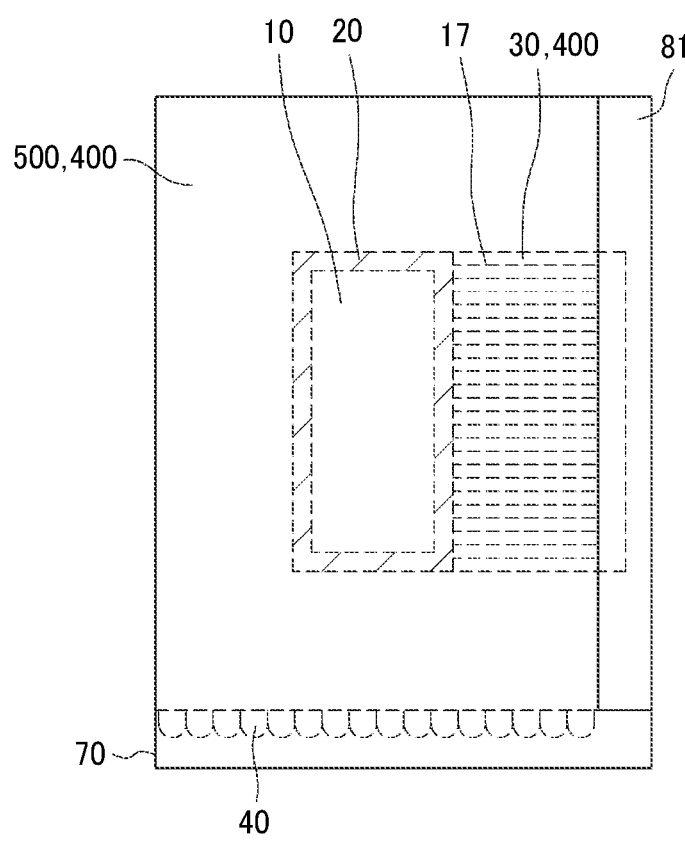
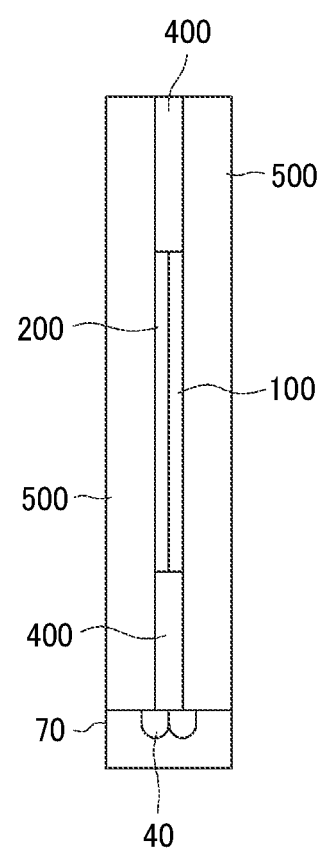

FIG. 31A
FIG. 31B
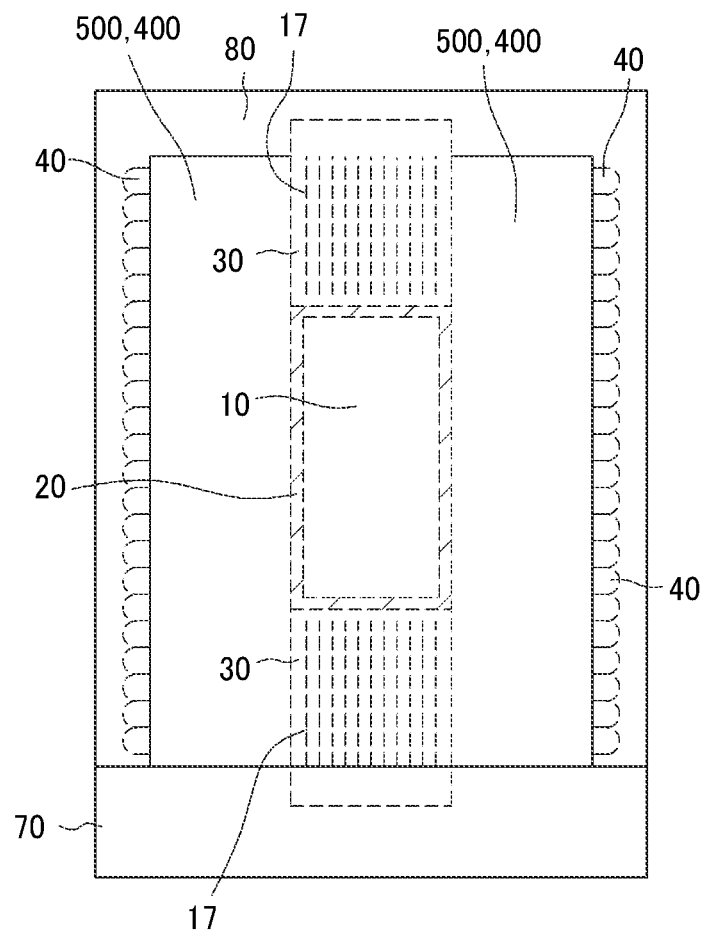
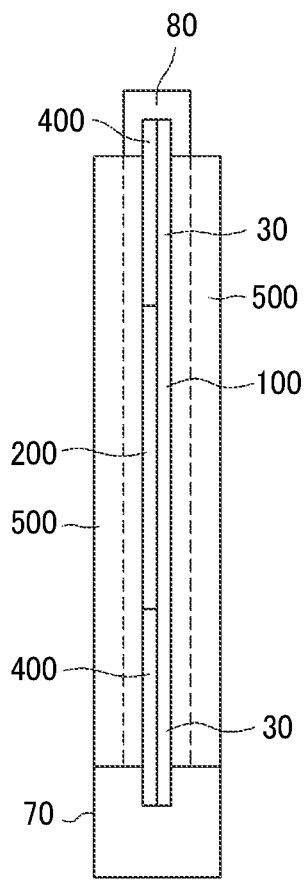

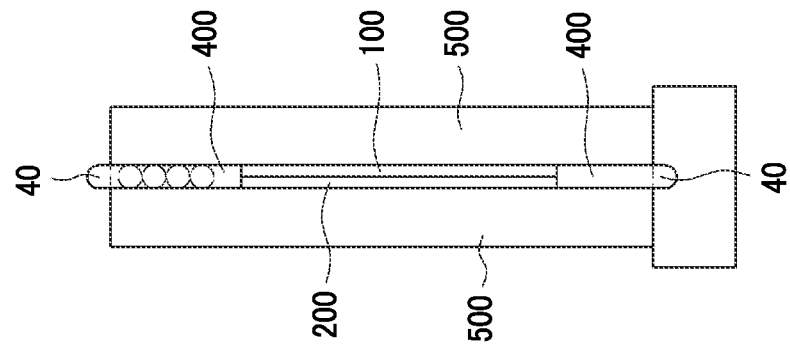
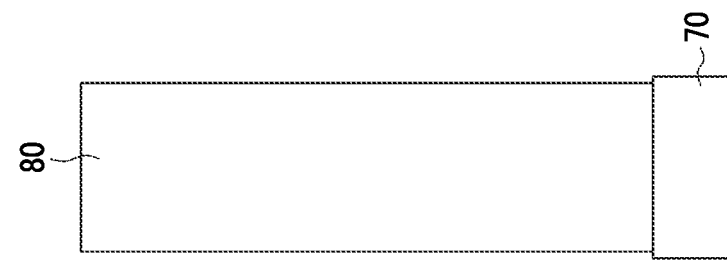
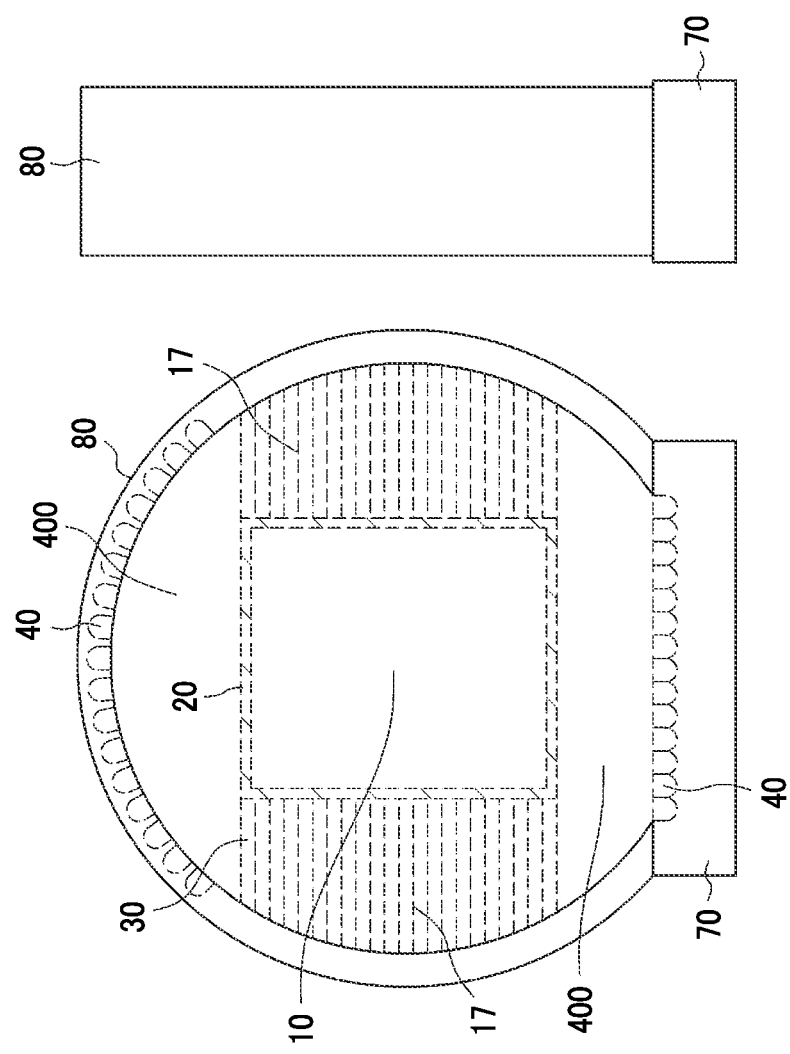

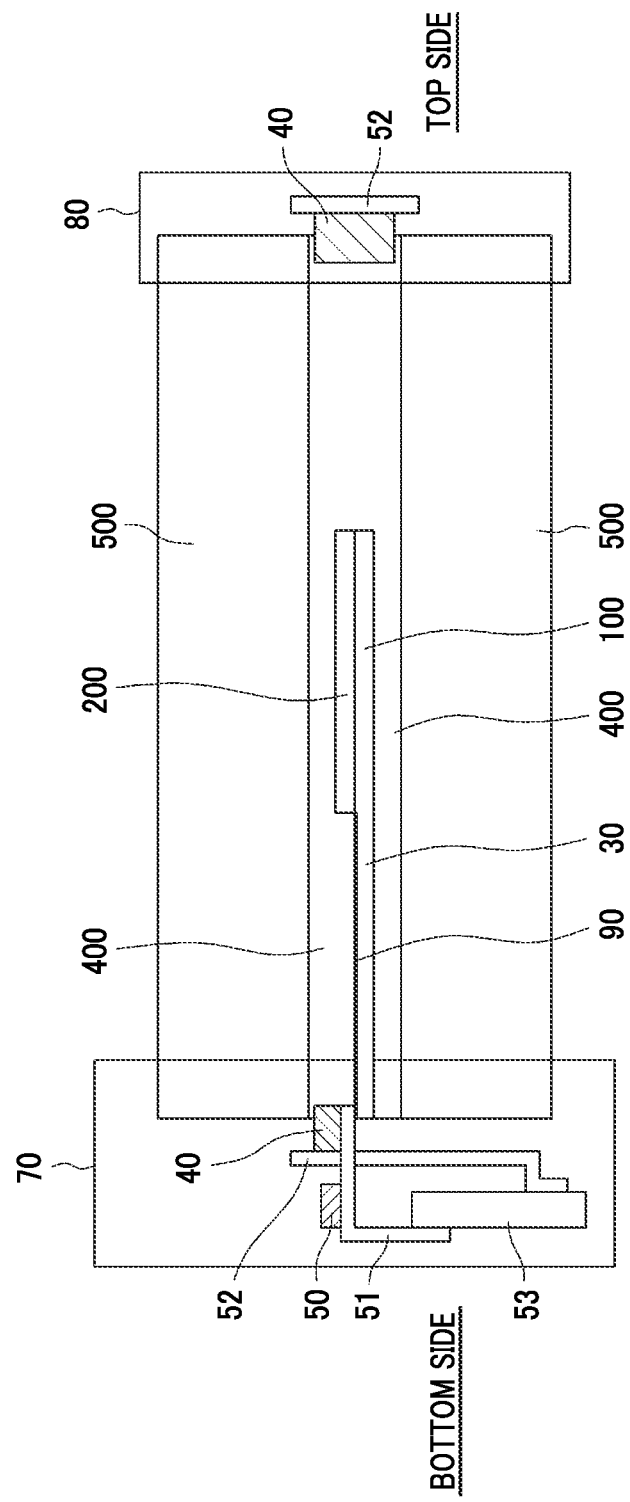

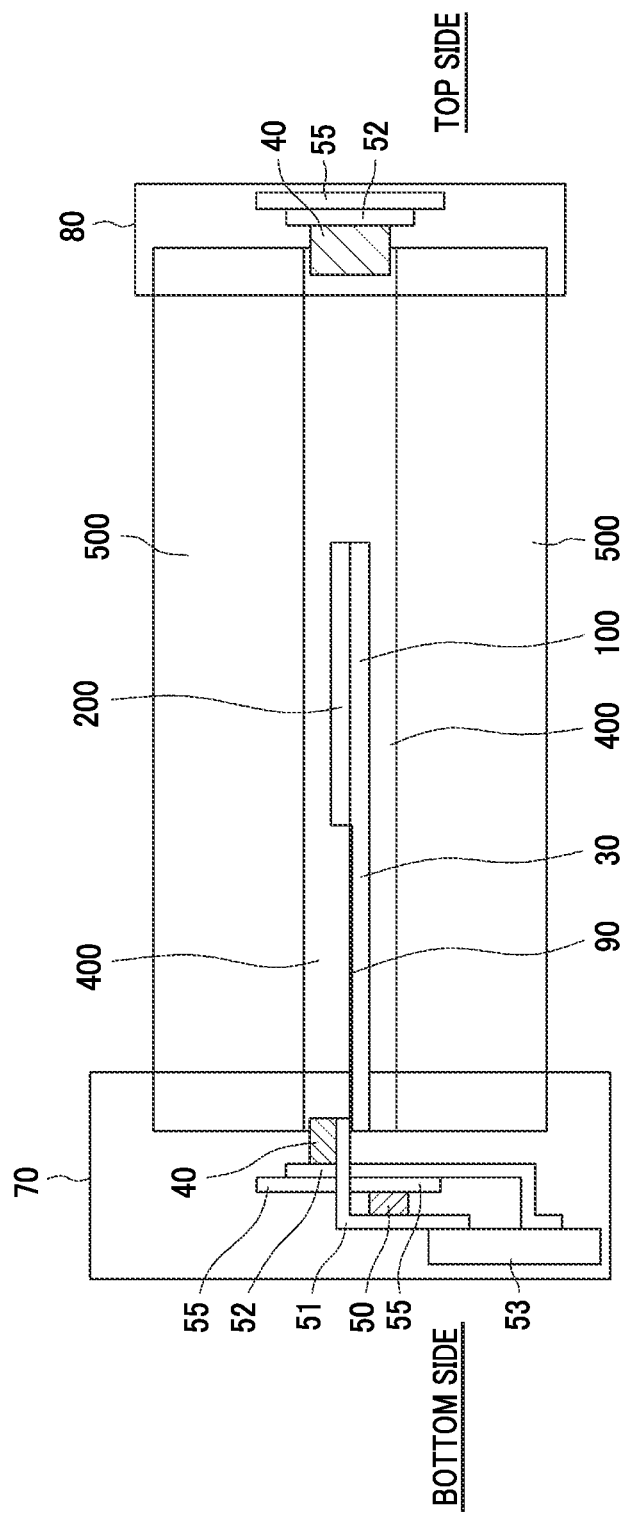

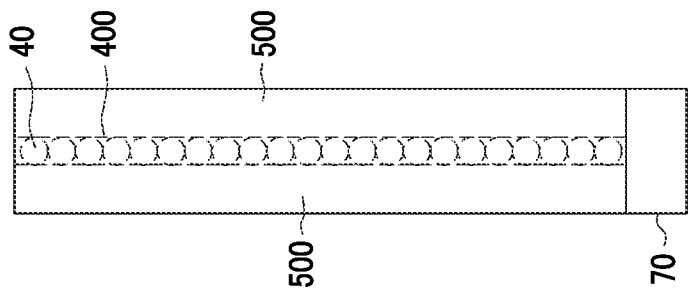
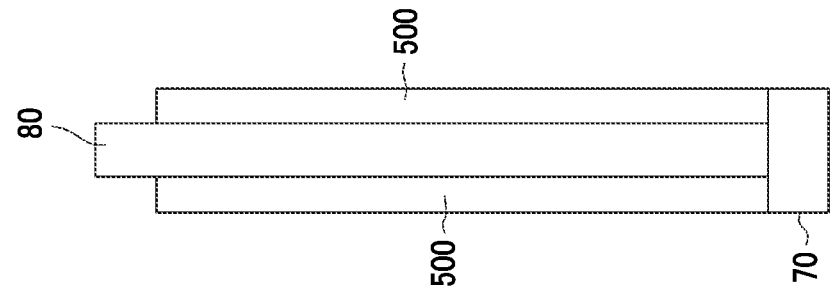
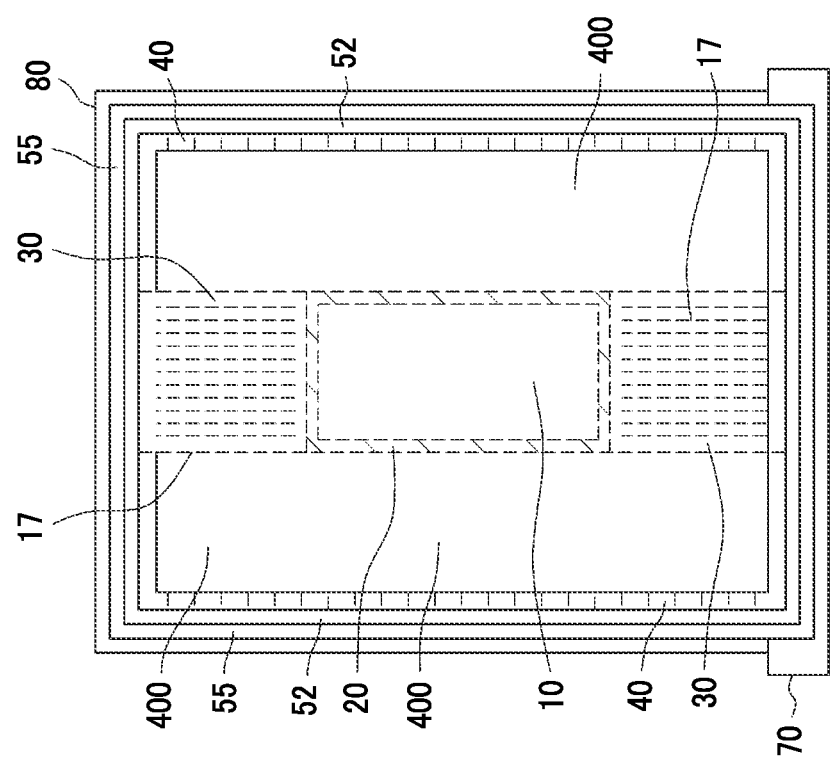

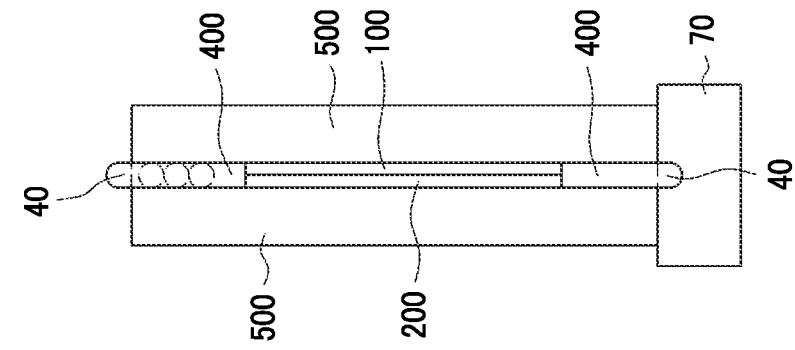
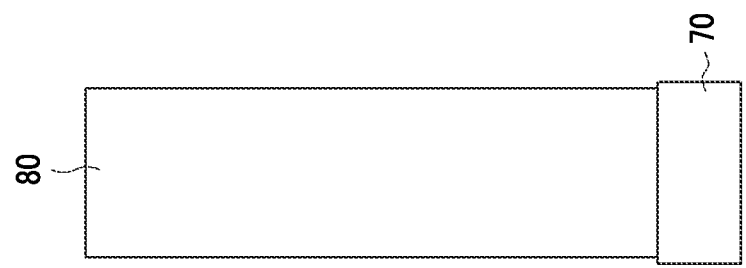
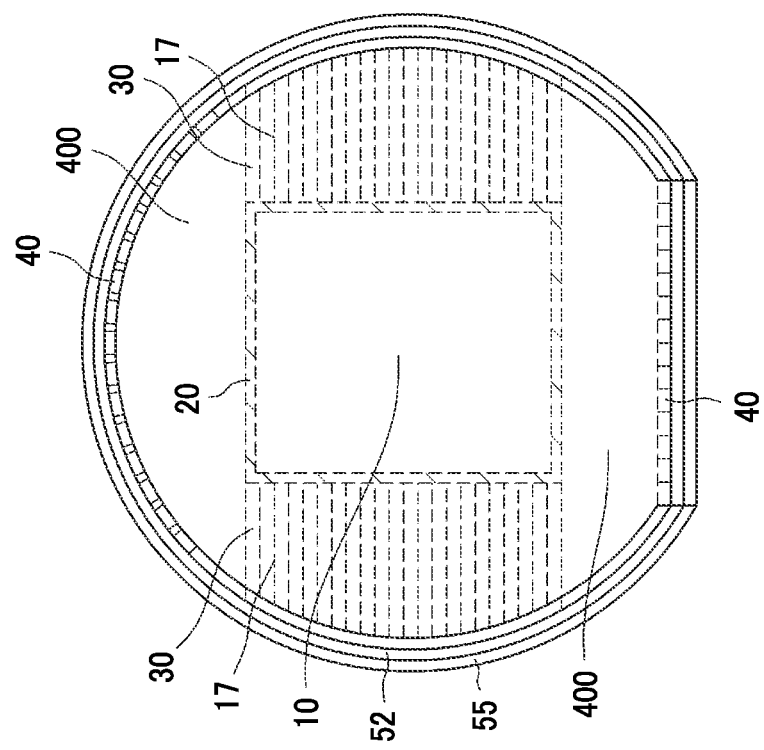

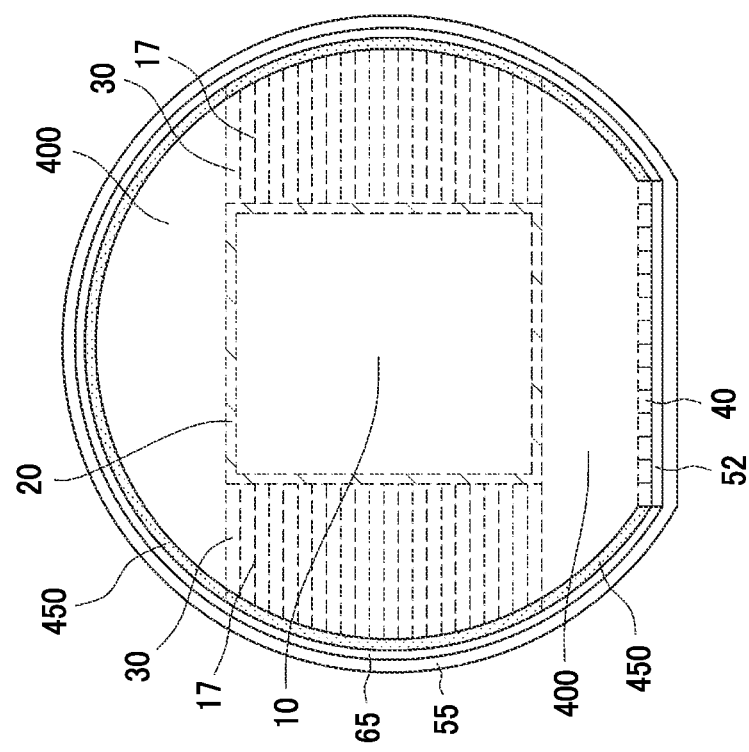

DISPLAY DEVICE

The present application is a continuation application of International Application No. PCT/JP2020/015178, filed on Apr. 2, 2020, which claims priority to Japanese Patent Application No. 2019-077615, filed Apr. 16, 2019. The contents of these applications are incorporated herein by reference in their entirety.

BACKGROUND OF THE INVENTION

(1) Field of the Invention

The present invention relates to a display device and, more particularly, to a transparent display device using a liquid crystal display panel or a transparent display device using a self-luminous element such as an organic EL display device or a micro LED display device.

(2) Description of the Related Art

There is a need for transparent displays, such as glass, where a background is visible. Such a transparent display can be realized by a liquid crystal display device which requires a backlight, or by a self-luminous display device which uses an organic EL display device or a micro LED display device. A display in which the background of the display is seen through is also called a transparent display or a transparent liquid crystal display panel.

Patent Document 1 discloses a configuration in which a transparent liquid crystal display panel is disposed on a back surface of a front sheet of an automatic vending machine, and an advertisement or the like is displayed on the transparent liquid crystal display panel. There is no particular backlight on the back of the transparent liquid crystal display panel. Instead of a backlight, light is applied from an LED arranged in a bezel of an automatic vending machine to selling items or the like in a vending machine, and a reflected light is used for the liquid crystal display panel as a backlight.

PRIOR ART REFERENCE

[Patent Document]
[Patent document 1] Japanese Translation of PCT International Application Publication JP 2015-505374A

SUMMARY OF THE INVENTION

Although the transparent liquid crystal display device described in Patent Document 1 basically has an advantage that it is possible to view the back of a liquid crystal display panel using a conventional liquid crystal display device, appliances which can adopt that system are limited.

On the other hand, a transparent display, in which a background is visible like glass, can be realized using a liquid crystal display panel, an organic EL display panel, a micro LED display panel, or the like. However, in order to display an image on these display panels, a large number of wirings, such as scanning lines, video signal lines, power supply lines, and the like, are required.

Signals and power supply voltages to the wirings are supplied from a flexible wiring substrate or a printed circuit board to a driver IC, and then to a display area via lead wires formed in a terminal region or the like. Normally, the region where these lead wires are formed becomes opaque, which is a problem for realizing a transparent display. In addition, in the liquid crystal display device, since a light source such as a backlight which is overlapped on the opposite side of the display surface is required, the presence of the backlight becomes a problem to realize such a transparent display.

It is an object of the present invention to provide a transparent display device in which images look like floating in a transparent medium.

Means for Solving the Problem

The present invention solves the above problem; representative measures are as follows.

(1) A display device including a transparent display device being fixed in a pedestal, the transparent display device having a display area and a first transparent medium, the first transparent medium existing between the display area and the pedestal, in which scanning lines and video signal lines are formed in the display area; scanning line lead wires and video signal lead wires are formed in the first transparent medium; and provided an area of the display area is S1, and an area of the first transparent medium is S2, S2/S1 is 0.5 or more.

(2) A display device including a transparent display device being fixed in a pedestal, in which the transparent display device is a liquid crystal display device having a display area and a first transparent medium, the first transparent medium is present between the display area and the pedestal; the display area is constituted from a liquid crystal layer sandwiched between a TFT substrate and a counter substrate, and scanning lines and video signal lines are formed on the TFT substrate; the first transparent medium is constituted from a terminal area in which scanning line lead wirings and video signal line lead wirings are formed on the TFT substrate; a second transparent medium is formed on the terminal area; LEDs are disposed at an edge of the first transparent medium or an edge of the second transparent medium; and provided an area of the display area is S1, and an area of the transparent medium is S2, S2/S1 is 0.5 or more.

BRIEF DESCRIPTION OF THE DRAWINGS

FIG. 3 is a cross-sectional view showing a basic operation of a transparent display using the liquid crystal;
FIG. 4 is a cross-sectional view of a liquid crystal display device used in the present invention;
FIG. 8 is a front view showing an operation of the transparent display device according to Embodiment 1;
FIG. 9 is a cross sectional view showing an operation of the transparent display device according to Embodiment 1.

FIG. 12A is a front view showing yet another structure of Embodiment 1:

FIG. 12B is a cross sectional view of FIG. 12A;

FIG. 18 is a cross sectional view of a fourth example of Embodiment 2;

FIG. 19 is a cross sectional view of another example of the fourth example of Embodiment 2;

FIG. 20A is a front view showing a first example of Embodiment 3;

FIG. 20B is a cross sectional view of FIG. 20A;

FIG. 20C is a cross sectional view of another example of the first example of Embodiment 2;

FIG. 21A is a front view showing a second example of Embodiment 3;

FIG. 21B is a cross sectional view of FIG. 21A

FIG. 21C is a cross sectional view of another example of the second example of Embodiment 3;

FIG. 24A is a front view showing another example of the outer shapes of the TFT substrate and the counter substrate;

FIG. 24B is a cross sectional view of FIG. 24A;

FIG. 26A is a front view showing the structure when outer shape of the outer housing is made circular;

FIG. 26B is a cross sectional view of FIG. 26 A along the line E-E;

FIG. 30A is a front view of the structure in which the display area is a longitudinally elongated rectangle in Embodiment 4;

FIG. 30B is a cross sectional view of FIG. 30A;

FIG. 31 A is a front view in which lead*out wirings are disposed above and below the display area in Embodiment 4;

FIG. 31B is a cross sectional view of FIG. 31A;

FIG. 32A is a front view of the structure in which outer shape of the display area is made circular in Embodiment 4;

FIG. 32B is a side view of FIG. 32A;

FIG. 32C is a cross sectional view of FIG. 32A;

FIG. 33 is a cross sectional view showing the structure in which the transparent display device is sandwiched by transparent gel in Embodiment 4;

FIG. 34 is a cross sectional view showing the structure in which the heat pipe is disposed in Embodiment 4;

FIG. 35A is a front view showing the structure in which the heat pipe is disposed in Embodiment 4;

FIG. 35B is a side view of FIG. 35A;

FIG. 35C is a side view of FIG. 35A in which the outer frame and the heat pipe are eliminated;

FIG. 36A is a front view of the structure in which the heat pipe is arranged when the outer shape of the display device is circular in Embodiment 4;

FIG. 36B is a side view of FIG. 36A;

FIG. 36C is a cross sectional view of FIG. 36A in which the outer frame and the heat pipe are eliminated;

FIG. 37A is a front view of the structure in which the light guide and the heat pipe are arranged;

FIG. 37B is a side view of FIG. 37A; and

FIG. 37C is a cross sectional view of FIG. 37A in which the outer frame and the heat pipe are eliminated.

DETAILED DESCRIPTION OF THE PREFERRED EMBODIMENTS

Figure 1:
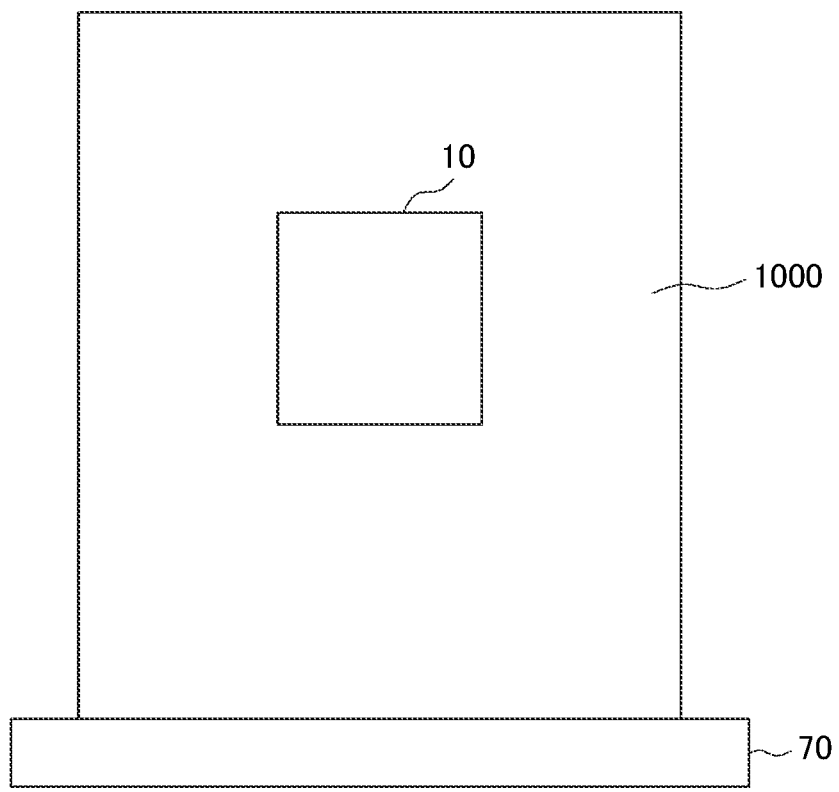
FIG. 1 is a front view of the transparent display device.

FIG. 1 is a front view of an example of the display device using a transparent display in which the present invention is applied. In FIG. 1, a display area 10 for displaying an image is formed near the center of a transparent medium 1000 made of glass or transparent resin. The transparent medium 1000 is fixed to the pedestal 70.

When an image is displayed on a transparent display such as in FIG. 1, an image appears to be floating. The back side of transparent medium 1000 is visible as a window. When no image is displayed, the rear side of the display area 10 can be seen. Also, even when an image is displayed in the display area 10, the back side may be seen through even in the display area 10 depending on the density of the display color.

To form an image, a video signal, a scanning signal, a power supply, and the like are necessary, and how to supply these signals to a display area becomes a problem. Further, when a liquid crystal display device is used, a light source such as a backlight is required, and how to supply light from the light source to the display area 10 is a problem. As in the conventional liquid crystal display device, if the backlight unit is disposed so as to overlap with the surface of the display area opposite to the display surface, the transparent display from which the back side is visible cannot be realized because the backlight unit is not transparent.

The Example shown below describes the specific structure for solving such a problem. In the following Embodiments, a liquid crystal display device is used as a display device, however, the present invention can be applied to a case where another display device such as an organic EL display device or a micro LED display device or the like is used.

In the following description, a transparent display including a liquid crystal display device, an organic EL display device, a micro LED display device, and the like may be referred to as a transparent display device, or simply referred to as a transparent display, and a display device including a transparent display device may be referred to as a display device. In addition, in the following description, a transparent display as shown in FIG. 1 may be referred to as a display floating in the air.

Embodiment 1

Figures 2A, 2B:
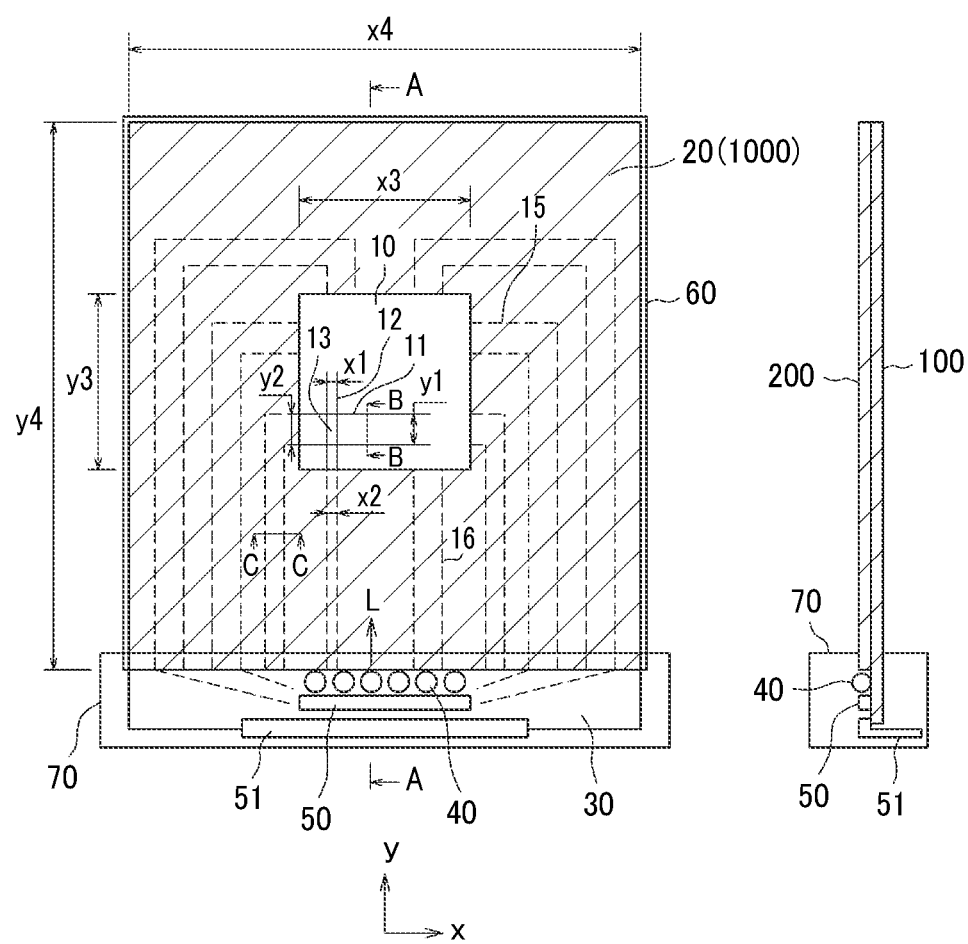
FIG. 2A is a front view of the transparent display device according to Embodiment 1.
FIG. 2B is a cross sectional view of FIG. 2A along the line A-A.

FIG. 2A is a plan view showing a configuration of a transparent display using a liquid crystal display device, and FIG. 2 B is a cross-sectional view taken along line A-A of FIG. 2A. In FIG. 2A, a display area 10 is formed near the center of a transparent medium such as glass. In the pedestal 70, a light source, for example, LEDs (Light Emitting Diode) 40 for supplying light to the liquid crystal display panel for displaying an image is arranged. In addition, a driver IC 50 for supplying a video signal, a scanning signal, a power source, and the like to the liquid crystal display panel, and a flexible wiring substrate 51 or the like for supplying these signals and the power source from the outside are housed in the pedestal 70.

In FIG. 2A, a transparent medium 1000 shown in FIG. 1 is present outside the display area 10. In the liquid crystal display device, a TFT substrate 100, on which a TFT (thin film transistor) and a pixel electrode are formed, and a counter substrate 200 are bonded to each other by a seal material 21, and liquid crystal is sealed inside. As will be described in detail later with reference to FIG. 3, the liquid crystal is, for example, a liquid crystal of a polymer scattering type; and when a voltage is not applied between the TFT substrate 100 and the counter substrate 200 (when an image is not displayed), light is transmitted through it without getting modulation, and the back side is seen through as a window in the display area 10. In the state (when an image is displayed) where voltage is applied between TFT substrate 100 and the counter substrate 200, on the other hand, the light incident in the liquid crystal from the LED 40 is scattered by the liquid crystal, and an image can be displayed on the first display surface 100a outside the TFT substrate (the surface opposite to the counter substrate 200) and the second display surface 200a outside the counter substrate 200 (the surface opposite to of the TFT substrate 100). In FIG. 2A, liquid crystal is present in the display area 10, and a transparent sealant 21 is present in a portion corresponding to the transparent medium. Hereinafter, the seal area 20 having the sealant 21 formed thereon is used synonymously with the transparent medium 1000 shown in FIG. 1.

In Embodiment 1, the entire seal area 20 is used as an area for lead wires. Incidentally, in the conventional liquid crystal display device, since a narrow frame design in which a frame region surrounding a display area including a seal area 20 is intended, the density of the lead wires is extremely high; and a region in which the lead wirings are arranged cannot be transparent. In the present invention, however, the entire wide seal area 20 can be used for the lead wires, thus, a pitch between the lead wires can be made large; consequently, transparency of the region for lead wires can be kept the same or more compared with the display area 10. The concrete structure is as follows.

In the display area 10, a scanning line 11 extends in a horizontal direction (x-direction) and is arranged in a vertical direction (y-direction), and a video signal line 12 extends in the vertical direction and is arranged in the horizontal direction. A pixel 13 is formed in an area surrounded by the scanning lines 11 and the video signal lines 12. A scanning line lead wire 15 and a video signal line lead wire 16 are arranged outside the display area 10.

The pitch 12 of the video signal line in the display area 10 is x 1, and the pitch of the scanning line 11 is y 1. Also, the pitch of the video signal line lead wire 16 is x 2, and the pitch of the scanning line lead wire 15 is y2. In this Embodiment, x 2≥x 1 and y 2≥y 1.

Incidentally, when the area of the display area 10 in FIG. 1 is S 1 and the transparent media, namely, the area of the seal area 20 in FIG. 2A is S 2, the ratio of the display area 10 and the seal area 20 is determined by the design request; however, in this Embodiment, it is necessary to set the ratio of the display area 10 and the seal area 20 in a certain range to maintain transparency in the seal area 20. Note that S 1 is x 3×y 3 in FIG. 2A, and S 2 is x 4×y 4−x 3×y 3 in FIG. 2A In other words, although lead wires are formed in the seal area 20, when the density of the lead wires becomes equal to or larger than the display area, the transparency of the seal area 20 decreases, and the value of the transparent display is significantly reduced. Therefore, it is necessary to increase the ratio of the display area 10 and the seal area 20, i. e., S 2/S 1, so that the wiring density in the seal area 20 does not become larger than that in the display area 10. From this point, S 2/S 1 is necessary to be 0.2 or more, preferably 0.5 or more, more preferably 1 or more, and still more preferably 2 or more.

The lead wires extend into the pedestal 70 while keeping the pitch at a certain size using a wide portion of the seal area 20. A terminal region 30 of a liquid crystal display panel is present in the pedestal 70; LEDs 40 as a light source, a driver IC 50 for driving video signal lines 12 are set on the terminal region 30, and a flexible wiring substrate 51 is connected to the terminal region 30 in the pedestal 70. Since the components mounted on the terminal region 30 are covered with the pedestal 70, the quality as a transparent display is maintained.

As an example, an interval between adjacent scanning lines 11 in the display area 10 is 200 μm, and an interval between adjacent video signal wirings 12 is 200 μm. On the other hand, an interval between adjacent scanning line lead wires 15 in the seal area 20 (peripheral region surrounding the display area 10) is 200 μm, an interval between adjacent video signal line lead wires 16 is 200 μm, and an interval between adjacent wiring lines is constant between the display area 10 and the seal area 20. This interval of 200 μm is an interval at which the wiring is difficult to be visually recognized for the viewer, and by making the interval between the wirings in the display area 10 and the seal area 20 uniform, the appearance of the display area 10 and the seal area 20 is made uniform, and the design quality is not impaired.

As shown in FIG. 2B, in this Embodiment, no backlight is present on the back surface of the TFT substrate 100. Further, since the LED 40 supplies light to enter the side surface of the TFT substrate 100 and the opposing substrate 200, that is, toward a plane orthogonal to the first display surface 100a and the second display surface 200a, the LED can be also called a side light 40. FIG. 3 is a cross-sectional view showing the basic operation of a transparent display using liquid crystal. FIG. 3 is an example of a liquid crystal display panel using a side light 40 without using a normal backlight, however, the present invention is not limited to the liquid crystal display panel of FIG. 3.

In FIG. 3, a liquid crystal layer 300 is sandwiched between a TFT substrate 100 on which a pixel electrode 130 is formed and a counter substrate 200 on which a common electrode 140 is formed. The TFT substrate 100 and the counter substrate 200 are bonded by a transparent sealant 21. An LED 40 is arranged in the terminal region 30 and supplies light from the side surface of the counter substrate 200 and the side surface of the transparent seal material 21.

This light propagates in the direction of the liquid crystal layer 300 while being reflected on the TFT substrate 100 and the counter substrate 200.

A driver IC 50 for forming video signals and scanning signals is mounted in the terminal region 30, and a flexible wiring substrate 51 for supplying power and signals to the liquid crystal display panel is connected to the terminal region 30. When a voltage is applied between the pixel electrode 130 and the common electrode 140, the liquid crystal molecules 301 rise. Then, light propagated through the liquid crystal layer 300 is scattered by liquid crystal molecules 301. In accordance with the voltage applied to the pixel electrode 130, light is scattered for each pixel, so that an image is formed by this scattered light. Since light is scattered on the side of the TFT substrate 100 of the liquid crystal display device and also on the side of the counter substrate 200, the image can be viewed from the second surface 200a (also referred to as the front surface of the transparent display) and from the first surface 100 a (also referred to as the rear surface of the transparent display).

FIG. 4 is a cross-sectional view showing a modified example of the transparent display using the liquid crystal of FIG. 3 to fit to the present invention. FIG. 4 is different from FIG. 3 in that a region in which the sealant 21 is formed, that is, a length of the seal area 20 is large. The operation principle is similar to that of FIG. 3. Light incident from the LED 40 reaches the liquid crystal layer 300 while being reflected by the TFT substrate 100 and the counter substrate 200. The sealant 21 is transparent, and light from the LED 40 propagates in the sealant 21 toward the liquid crystal layer 300. In FIG. 4, in the sealant 21, light from the LED 40 travels straight in the horizontal direction, but this is an example, and most of the light reaches the liquid crystal layer 300 while repeating reflection on the sealant 21 or the TFT substrate 100, the counter substrate 200, or the like. The principle of image formation is the same as described in FIG. 3.

The scanning line 11, the video signal line 12, the scanning line lead wire 15, the video signal line lead wire 16, and the like are made of metal in order to reduce the resistance, however, the metal reflects the external light; consequently, the quality of the transparent display is impaired. In this Embodiment, the metal lead wiring is sandwiched by a top layer and a base layer, which have lower reflectivity; thus, reflectance of external light is suppressed.

Figure 5:
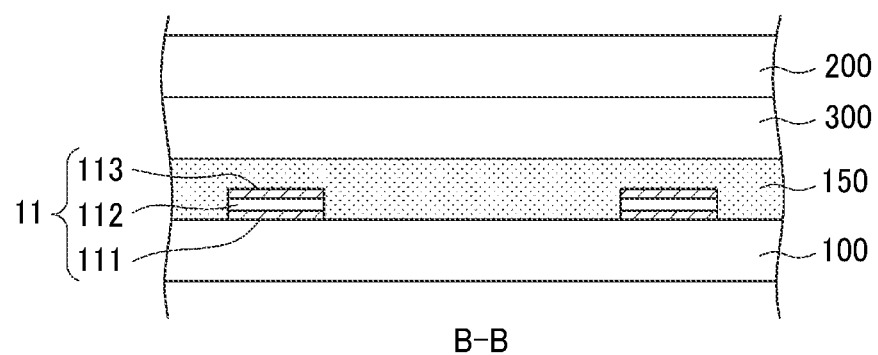
FIG. 5 is a cross sectional view showing the structure of a scanning line.

FIG. 5 is a cross-sectional view of a portion of the display area 10 where the scanning line 11 is formed, and corresponds to a cross section taken along line B-B of FIG. 2A. In FIG. 5, a scanning line 11 is formed on a TFT substrate 100, and an organic insulating film 150 formed of acrylic resin or the like covers the scanning line 11. A liquid crystal layer 300 is present between the counter substrate 200 and the organic insulating film 150. A scanning line 11 in FIG. 5 includes a base layer 111, a metal layer 112, and a cap layer 113. The metal layer 112 is formed of, for example, an Al alloy. The base layer 111 and the cap layer 113 are antireflection films, and are formed of, for example, titanium nitride (TiN). Titanium nitride (TiN), for example, has a thickness of about 8 nm, and can work as an antireflection film. The reason why an antireflection film is used for the base layer 111 and the cap layer 113 is that an image formed on the liquid crystal display device in this Embodiment is visible from the front and back sides. The video signal line 12 and so forth are the same. Although not shown in the drawing, the video signal line 12 is located between the scanning line 11 and the organic insulating film 150, and an interlayer insulating film is provided between the scanning line 11 and the video signal line 12. Both the scanning line 11 and the video signal line 12 are located between the organic insulating film 150 and the TFT substrate 100, and the scanning line 11 and the video signal line 12 are covered with the organic insulating film 150.

Figure 6:
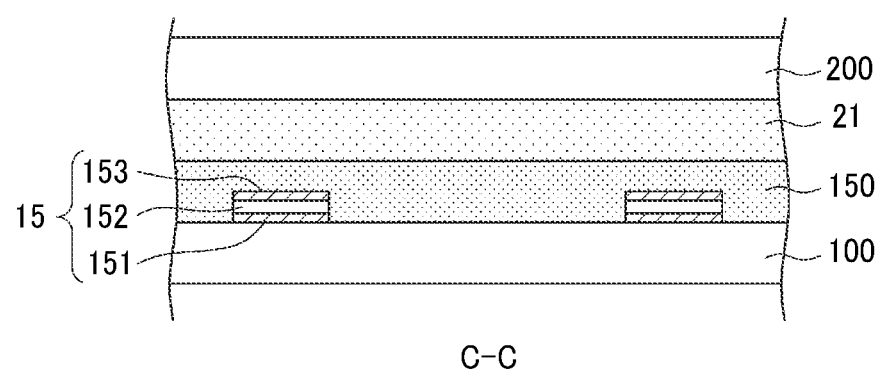
FIG. 6 is a cross sectional view showing the structure of a scanning line lead wire.

FIG. 6 is a cross-sectional view of the seal area 20 and corresponds to the C-C section of FIG. 2A. FIG. 6 differs from FIG. 5 in that, instead of the liquid crystal layer 300, a transparent sealing material 21 is formed between the organic insulating film 150 and the counter substrate 200. In FIG. 6, the scanning line lead wire 15 includes a base layer 151, a metal layer 152, and a cap layer 153. That is, it is the same structure as the scanning line 11. Therefore, reflection from the scanning line lead wire 15 can be prevented.

Although not shown in the drawing, the video signal line lead wire 16 is located between the scanning line lead wire 15 and the organic insulating film 150, and an interlayer insulating film is provided between the scanning line lead wire 15 and the video signal line lead wire 16. Both the scanning line lead wire 15 and the video signal line lead wire 16 are provided between an organic insulating film 150 and a TFT substrate 100; and both the scanning line lead wire 15 and the video signal line lead wire 16 are covered by the organic insulating film 150. The layer structure of the various wirings is common in the display area 10 and the seal area 20.

FIG. 5 and FIG. 6 show a scanning line 11 and a scanning line lead wire 15, however, a similar antireflection structure is provided for the video signal line 12, the video signal line lead wire 16 and the like. In a liquid crystal display device, a common electrode 140 is formed, and a wiring for supplying a voltage to the common electrode 140 is often formed widely. However, wide electrodes reduce transparency and degrade quality as transparent displays. Thus, it is preferable to divide such wiring. In other words, it is preferable that the display area 10 and the seal area 20 have uniform transparency as much as possible.

Referring back to FIG. 2A, the side surfaces of the TFT substrate 100, the sealant 21 constituting the seal area 20, and the counter substrate 200 are covered by refection film 60 except the side surface in which the LEDs 40 are set. That is, since not all the light from the LEDs, disposed in the terminal region 30, does not go straight, light from the LED 40 is reflected on the side surface of the display panel, thereby enhancing the utilization efficiency of light.

Figure 7A:
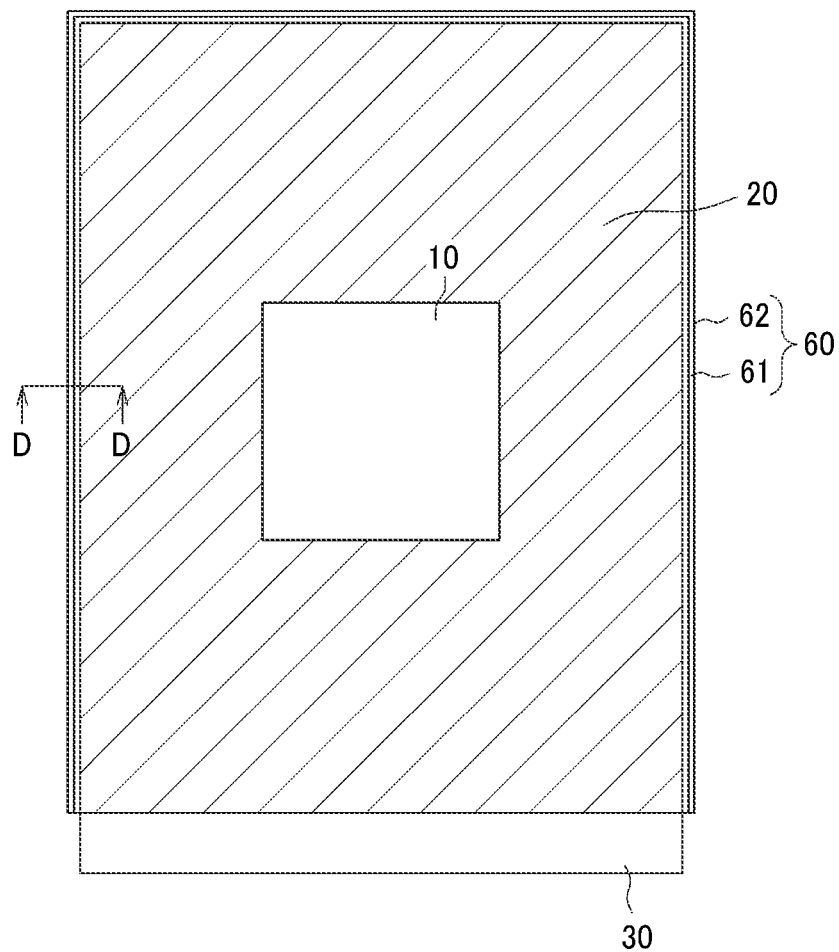
FIG. 7A is a front view of the transparent display panel according to Embodiment 1.

FIG. 7A is a plan view of a display panel in which a reflective film 60 is formed. In FIG. 7A, a seal area 20 is formed around the display area 10. The display area 10 and the seal area 20 are formed in a region where the TFT substrate 100 and the counter substrate 200 overlap each other, and the terminal portion 30 that is disposed at a lower portion of FIG. 7A is a portion where the TFT substrate 100 does not overlap the counter substrate 200.

Figure 7B:
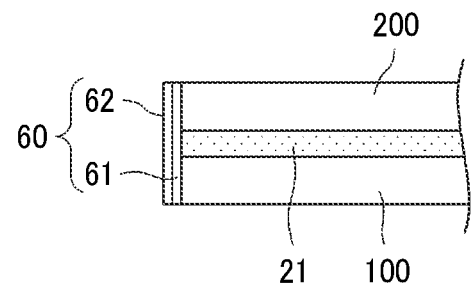
FIG. 7B is a cross sectional view of FIG. 7A along the line D-D.

In FIG. 7A, a reflective film 60 is formed on a side surface. The reflective film 60 has a two layer structure. FIG. 7B is a cross-sectional view taken along line D-D of FIG. 7A. An inside of the reflective film 60 is a reflective layer 61 which reflects light from the LED with high reflectivity. However, when the reflection layer 61 is exposed on the side surface, the reflection of the external light is conspicuous, so that an exterior layer 62, in consideration of the design property, is formed outside the reflection layer 61.

FIG. 2A shows a configuration in which a plurality of LEDs 40 are arranged corresponding to one side of the display area 10. Incidentally, when an image is displayed in the display area 10, there is a case where the luminance of the display area 10 is not enough. In such a case, as shown in FIG. 8, the LEDs can be disposed in the pedestal 70 over the entire side of the terminal region 30. In such a case, too, as shown by an arrows in FIG. 8, light from the LED 40, disposed on the outside, is reflected at the side surface at the edge of the TFT substrate 100, the counter substrate 200, or the seal material 21, and finally enters the display area 10 to form an image.

FIG. 9 is a cross-sectional view showing another example in which it is desired to further enhance the luminance of the display area 10. In FIG. 9, two LEDs 40 are arranged in the cross-sectional direction. Light from the LED 40 disposed on the back side of the TFT substrate 100 is also incident in the TFT substrate 100 or the counter substrate 200, and propagates toward the liquid crystal layer 300 in which the display area 10 is formed, while repeating reflection on the TFT substrate 100 and the counter substrate 200.

Although FIG. 9 shows an example in which two LEDs 40 are arranged in the cross-sectional direction, if it is desired to further enhance the luminance of the display area 10, it is also possible to dispose three or more LEDs 40 in the cross-sectional direction. In such a case, if the light guide is disposed between the LED 40 and the TFT substrate 100 or the counter substrate 200, the efficiency of the light from the LED 40 to be incident on the liquid crystal layer 300 can be further improved.

The transparent display shown in FIG. 2B includes a transparent TFT substrate 100 and a counter substrate 200. The transparent substrate may be formed of a heat-resistant resin such as polyimide or glass. For example, a thickness of a glass substrate is generally about 0.5 or 0.7 mm, and a thickness of a transparent display is about 1 or 1.7 mm. If such a thin transparent display is required due to design requirements, it may be acceptable, however, as a general transparent display, mechanical strength may be a problem.

Figure 10:
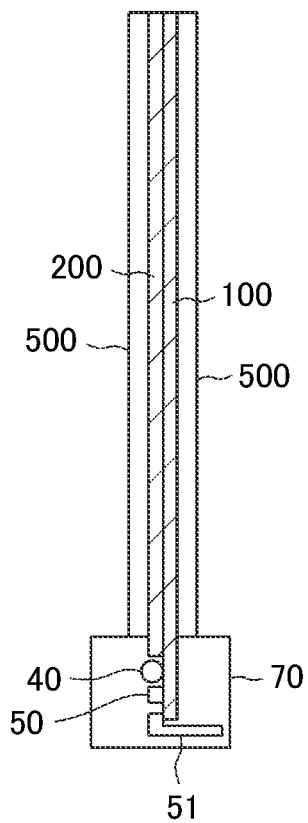
FIG. 10 is a cross sectional view of another structure according to Embodiment 1.

FIG. 10 shows an example in which this is taken into account; namely, the transparent display is sandwiched between transparent outer housings 500. As the transparent outer housing 500, glass or resin can be used. The outer housing 500 is attached to the TFT substrate 100 and the counter substrate 200, which constitute the transparent display, by a transparent adhesive or a transparent pressure sensitive adhesive material. As the transparent adhesive, an ultraviolet curable transparent resin can be used.

Since no high temperature process is present after the outer housing 500 is attached, the transparent resin can be selected from a relatively wide range. If the refractive index of the outer housing 500 is smaller than the refractive index of the TFT substrate 100 or the counter substrate 200, light from the LED 40 can be confined in the transparent display, so that light from the LED 40 can be used more efficiently.

Figure 11:
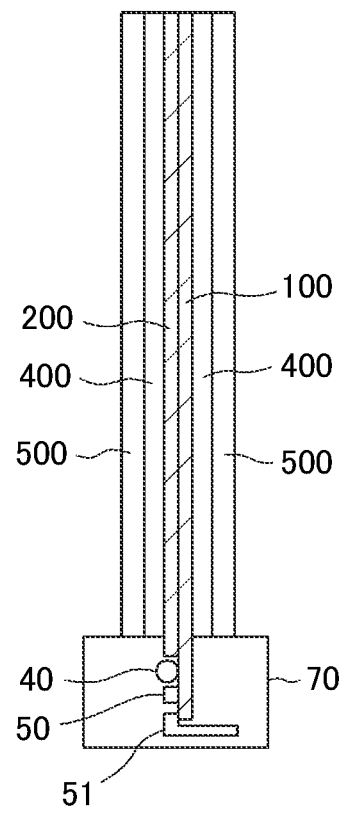
FIG. 11 is a cross sectional view of yet another structure according to Embodiment 1.

FIG. 11 shows another example of improved mechanical strength of a transparent display. FIG. 11 shows an example in which the transparent display is sandwiched by an inner housing 400 formed of a transparent substrate, and further, the outer side of the inner housing 400 is sandwiched by an outer housing 500. The transparent display, the inner housing 400, and the outer housing 500 are bonded together using a transparent adhesive material as explained in FIG. 10.

The outer housing 500 may be formed of a glass plate or a resin plate. When the outer housing 500 is formed of resin, it can be selected from a wide range of resin materials because the transparent display does not pass through the high-temperature process after the outer housing 500 is attached. If the refractive index of the outer housing 500 is made smaller than the refractive index of the inner housing 400, light from the LED 40 can be confined inside, so that the utilization efficiency of light from the LED 40 can be improved. When the relation is taken as, the refractive index of the outer housing 500<the refractive index of the inner housing 500<the refractive index of the transparent display formed of the TFT substrate and the counter substrate, the utilization efficiency of light from the LED 40 can be maximized.

In the configuration shown in FIGS. 2A and 2B, the LED 40 and the driver IC 50 are disposed in close proximity to the terminal region 30 having a small area. Both the LED 40 and the driver IC 50 generate heat. Therefore, there is a risk that the portion where the LED 40 and the driver IC 50 are disposed becomes extremely high in temperature. FIG. 12A is a plan view and 12B is a cross-sectional views illustrating an example of the structure to address this problem.

FIG. 12A is the same as FIG. 2A except for terminal region 30. In FIG. 12A, only the LEDs 40 are disposed in the terminal region 30, and the flexible wiring substrate 51 is connected to the terminal region 30. FIG. 12B is the same as FIG. 2B except for the interior of pedestal 70. In FIG. 12B, a flexible wiring substrate 51 connected to a terminal region 30 extends to the back side, and a driver IC 50 is mounted at an extended portion. As shown in FIG. 12B, since the LED 40 and the driver IC 50 are located at a separate location, the problem of local heat generation is mitigated compared with the case of FIG. 2A or FIG. 2B.

Embodiment 2

In view of design, the side of the transparent display may be covered with an outer frame 80. In other words, the outer frame 80 may have a design effect. In such a case, since the periphery of the transparent display is covered with the outer frame 80, the configuration of the transparent display increases more degrees of freedom.

Example 1

Figures 13A, 13B:
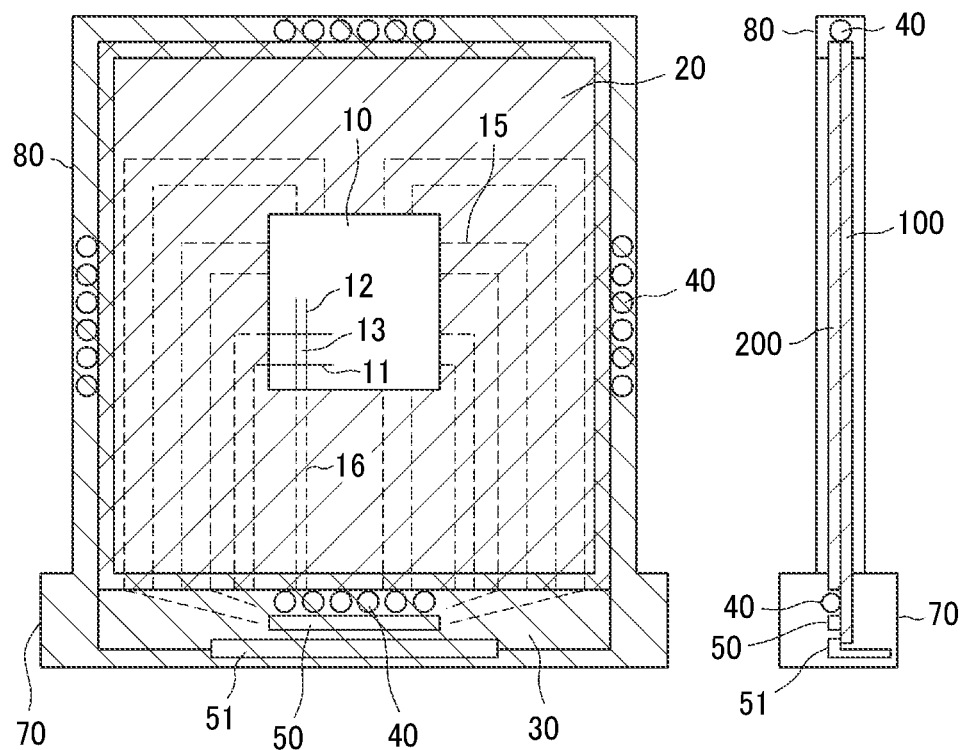
FIG. 13A is a front view showing a first example of Embodiment 2.
FIG. 13B is a cross sectional view of FIG. 13A

FIG. 13A is a front view of a transparent display having an outer frame 80. The transparent display of FIG. 13A is the same as the transparent display shown in FIG. 2A. In FIG. 13A, the LEDs 40 are disposed at a portion hidden by an outer frame 80 at 3 sides of a transparent display. As a result, it is possible to significantly enhance the luminance of the display area 10 in FIG. 13A compared with the case of FIG. 2A. FIG. 13B is a cross-sectional view of FIG. 13 A. FIG. 13B is the same as FIG. 2B, except that an outer frame 80 is present.

Figure 14:
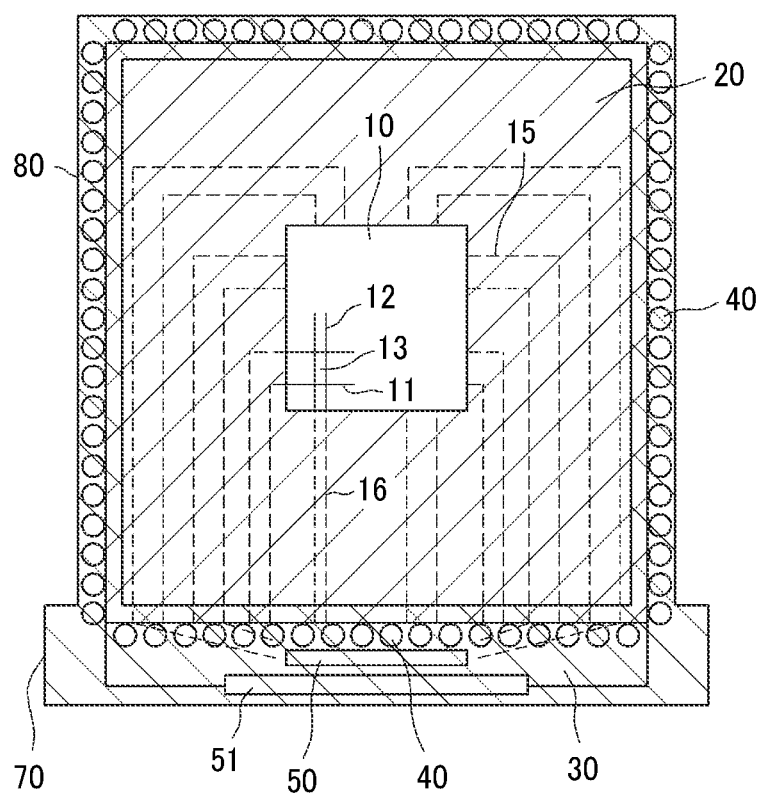
FIG. 14 is a front view showing another example of first example of Embodiment 2.

FIG. 14 is a modification of FIG. 13A. In FIG. 14, the LEDs 40 are disposed over the entire periphery of the 4 sides of the transparent display. In the configuration of FIG. 14, the screen luminance can be further improved than in FIG. 13. In FIG. 14, the LEDs 40 are arranged uniformly on each side. However, the arrangement density of the LEDs 40 may be varied on each side. For example, it is possible to increase the utilization efficiency of light from the LED 40s by making the arrangement density of the LEDs 40 larger in the vicinity of the center of each side than in the vicinity of the corner of each side.

Example 2

Figures 15A, 15B:
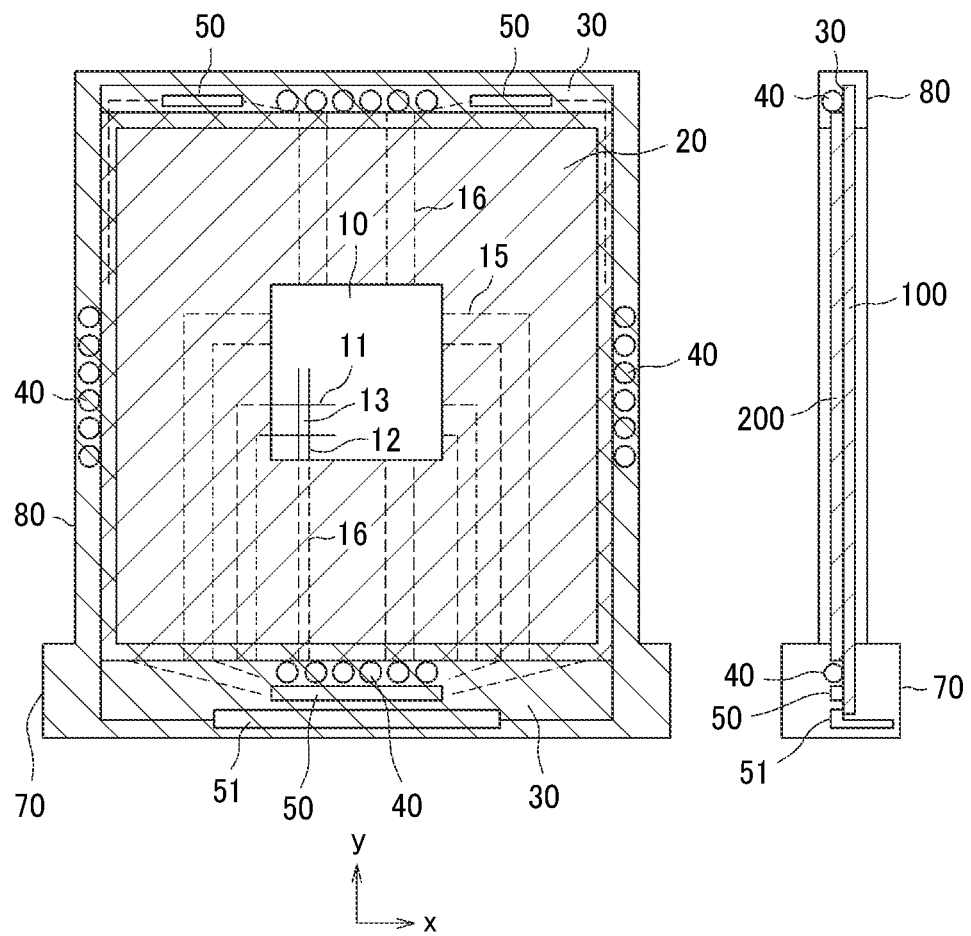
FIG. 15A is a front view showing a second example of Embodiment 2.
FIG. 15B is a cross sectional view of FIG. 15A.

FIG. 15A is a plan view showing Example 2 of Embodiment 2. In FIG. 15A, a terminal region 30 is formed at the upper end in the y-direction in addition to the lower end in the y-direction. In addition to the LEDs 40, the driver ICs 50 for driving the video signal line 12 are disposed in the upper terminal region 30. In order to reduce the width of the terminal region 30 and reduce the width of the outer frame 80, the driver ICs 50 are arranged at a location remote from the LED 40 in the x-direction in the upper terminal region 30 of FIG. 15A.

In FIG. 15A, the video signal line lead wire 16 extends downward in the y-direction with respect to the display area 10, but also extends upward in the y-direction with respect to the display area 10. By extending the video signal line lead wire 16 upward and downward, the arrangement density of the video signal line lead wire 16 can be made smaller than in the case of FIG. 2A. Thus, the transparency in the seal area 20 can be increased.

In FIG. 15A, the driver IC 50 of the upper terminal region 30 is disposed outside the LED 40 in the x direction. A wiring extending from the driver IC 50 toward the pedestal 70 extends through an area covered by the outer frame 80 as indicated by a broken line in FIG. 15A. Since this portion is not visible from the outside, even if the wiring density is increased, the quality of the transparent display is not affected. In addition, in the upper terminal region 30 of FIG. 15A, the LED 40 and the driver IC 50 can be arranged slightly apart from each other, so that the problem of heat generation is alleviated.

FIG. 15B is a cross-sectional view of FIG. 15A. FIG. 15B differs from FIG. 13B in that a terminal region 30 is formed on the upper side. Since the terminal region 30 is housed in the outer frame 80, it cannot be seen from the outside. Other configurations of FIG. 15B are similar to FIG. 13B.

In FIG. 15A, a plurality of LEDs 40 are arranged in the range corresponding to the display area 10, but as shown in FIG. 14, the LEDs 40 may be arranged on the entire side of the transparent display 40. Thus, the screen luminance can be improved.

Note that, in FIGS. 15A and 15B, the terminal region 30 is formed on the upper side, but it is also possible that the terminal region 30 is not formed on the upper side; instead, the image signal line lead wires 16 which extend upward are bundled together at a portion where the transparent display is covered by the outer frame 80, and pass through the peripheral region hidden by the outer frame 80 toward the pedestal 70. In this case, the peripheral region of the transparent display hidden by the outer frame 80 has a very large density of lead wires, however, this portion cannot be seen from the outside, and therefore, the quality of the transparent display does not deteriorate.

Example 3

Figure 16:
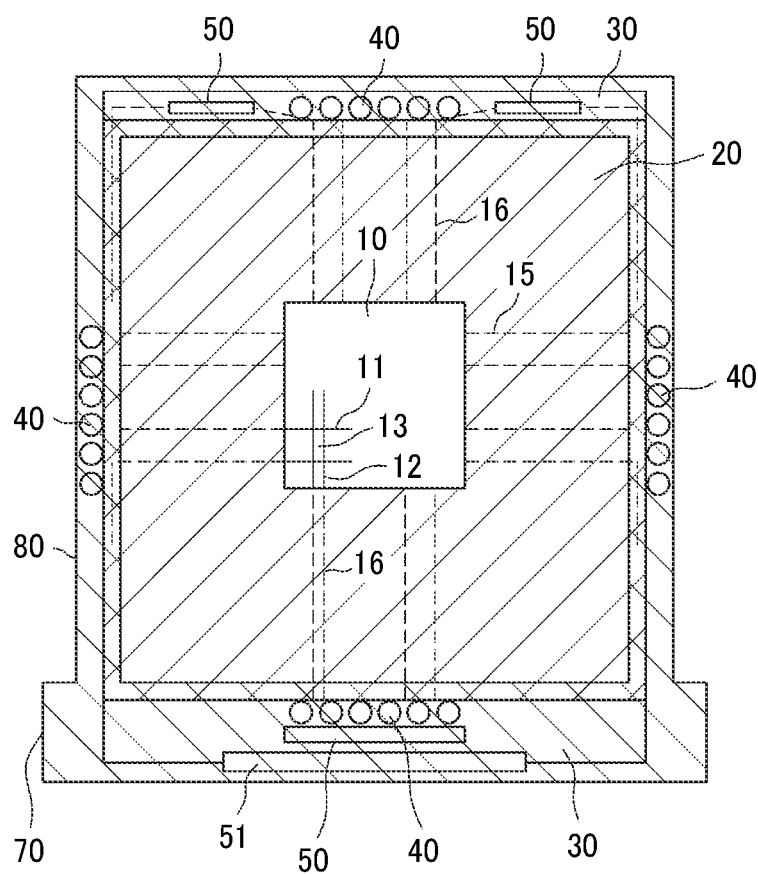
FIG. 16 is a front view showing a third example of Embodiment 2.

FIG. 16 is a front view showing Example 3 of Embodiment 2. FIG. 16 is different from FIG. 15 in that the scanning line lead wire 15 extends laterally to the vicinity of the end of the seal area 20. The scanning line lead wires 15 extending in the lateral direction are bundled in the peripheral portion where the transparent display is hidden in the outer frame 80, and extend toward the pedestal 70. At a portion hidden by the outer frame 80, the density of the scanning line lead wire 15 becomes extremely large but cannot be visually recognized from the outside, so that the quality of the transmission type display is not affected.

In FIG. 16, since the wiring density can be reduced in the seal area 20 than in the case of FIG. 15, the transparency of the seal area 20 can be further improved. In FIG. 16, a plurality of LEDs 40 are arranged in the range corresponding to the display area 10, but as shown in FIG. 14, the LEDs 40 may be arranged on the entire side of the transparent display 40. Thus, the screen luminance can be improved.

Figure 17:
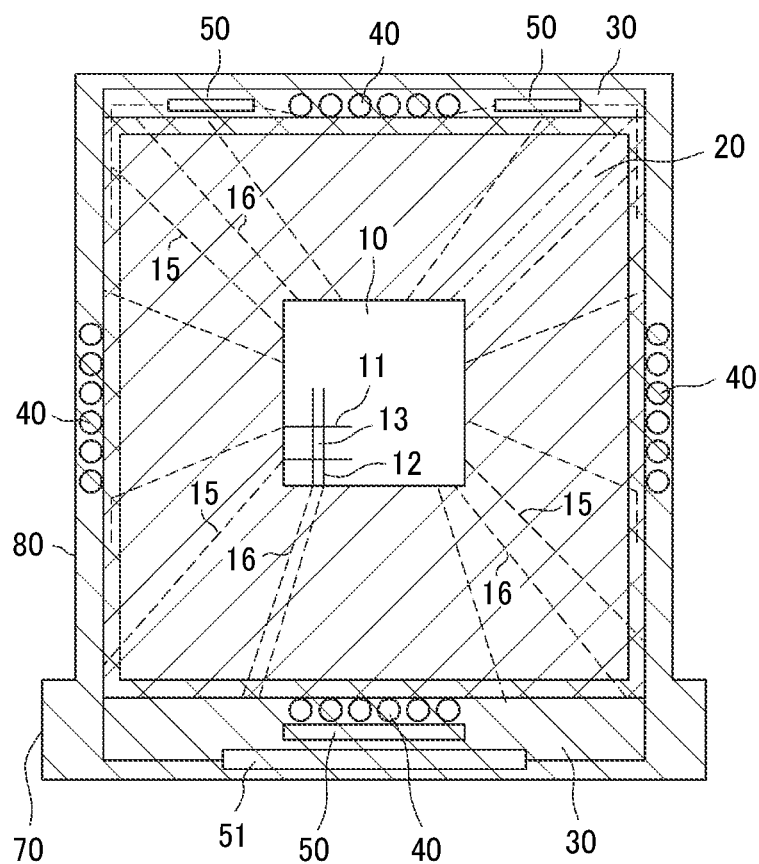
FIG. 17 is a front view showing another example of the third example of Embodiment 2.

FIG. 17 is a modification of FIG. 16. FIG. 17 is different from FIG. 16 in that the scanning line lead wire 15 and the video signal line lead wire 16 are arranged in a radial manner. Thus, the wiring density of the scanning line lead wire 15 and the video signal line lead wire 16 can be further reduced, so that the transparency of the seal area 20 can be further improved.

Example 4

FIG. 18 shows an example in which the transparent display is sandwiched by the outer housing 500 when the outer frame 80 is present. The effect of FIG. 18 is the same as that described in FIG. 10 of Embodiment 1. FIG. 19 shows an example in which, when an outer frame 80 is present, a transparent display is sandwiched by an inner housing 400 and an outer side thereof is sandwiched by an outer housing 500. The effect of FIG. 19 is the same as that described in FIG. 11.

Embodiment 3

In Embodiment 3, an outline of a display device including a transparent display is other than a rectangle. Although the following Embodiment describes a case in which the shape of the display device is a circle as a shape other than a rectangle, the contents described in this Embodiment can be applied to a case where the outline is other than a circle.

Example 1

FIG. 20A is a plan view showing Example 1 of Embodiment 3. In FIG. 20A, the outline of the display device is a circle, and the outer periphery is covered with an outer frame 80. A rectangular transparent display is disposed inside the display. The configuration of the rectangular transparent display is the same as that of FIG. 2A in Embodiment 1.

In FIG. 20A, an inner housing 400 is disposed between a rectangular transparent display and a circular outer frame 80. Generally, the inner housing 400 is formed of a transparent resin. The periphery of the inner housing 400 is covered with an outer frame 80, and the LEDs 40 as a light source are disposed at a portion where the inner housing 400 is covered with the outer frame 80.

Even a light source, which is disposed only in pedestal 70, can operate a transparent display, a brighter screen, however, can be realized by arranging the light source around the inner housing 400. In FIG. 20A, in order to make the boundary between the transparent display and the inner housing 400 inconspicuous, it is preferable to use materials, in which the refractive indices are as close as possible, for the transparent display and the inner housing 400. The inner housing 400 and the outer housing 500 are joined together by a transparent adhesive material.

FIG. 20B is a cross-sectional view of FIG. 20A. On the upper side of the transparent display, an inner housing 400 is disposed between the outer frame 80 and the transparent display. The transparent display and the inner housing 400 are bonded to each other by a transparent adhesive on the bonding surface. In FIG. 20B, an LED 40 as a light source is disposed on a side surface of an upper end portion of the inner housing 400, and light from the LED 40 is supplied to the display area 10 through the inner housing 400 and the seal area 20 of the transparent display.

FIG. 20C is a cross-sectional view showing a configuration in which the transparent display and the inner housing 400 are sandwiched by the outer housing 500. The outer housing 500 and the transparent display or inner housing 400 are bonded using a transparent adhesive. In FIG. 20C, the outer housing 500 has a substantially circular shape. The refractive index of the outer housing 500 is preferably smaller than that of the transparent display or inner housing 400. By setting the refractive index relation in this way, light from the LED 40 can be confined inside to form a brighter screen.

Example 2

FIG. 21A is a front view of Example 2 of Embodiment 3. FIG. 21A shows a case where the profile of the transparent display itself is a circle. In this case, the terminal region has a shape different from a circle. Therefore, it may be difficult to form the TFT substrate 100 of the transparent display using glass. Even with such a shape, when the TFT substrate 100 and the counter substrate 200 are formed of a resin such as polyimide, the external shape can be set relatively freely. For example, punching or the like may be applied.

In FIG. 21A, a display area 10 is formed near the center of the transparent display. Further, arrangement of the scanning line 11, the video signal line 12, the scanning line lead wire 15, and the video signal line lead wire 16 are the same as in FIG. 20A. However, in FIG. 21A, the outline of the transparent display is circular, and the outer periphery of the transparent display is surrounded by the outer frame 80.

Light from the LED 40 is incident on the side surfaces of the TFT substrate 100 and the counter substrate 200. Therefore, it is the same as in FIG. 13A of Embodiment 2, except that the outer shapes of the TFT substrate 100 and the counter substrate 200 are circular. FIG. 21B is a cross-sectional view of FIG. 21A FIG. 21B is similar to FIG. 13B of Embodiment 2, except that the TFT substrate 100 and the counter substrate 200 are likely to be formed of resin.

FIG. 21C is a cross-sectional view of a case where the transparent display is sandwiched by the outer housing 500. Attachment of the outer casing 500 to the transparent display can be performed using a transparent resin. The effect is the same as described in FIG. 10, FIG. 11, and the like of Embodiment 1. Further, if the refractive index of the outer housing 500 is made smaller than the refractive index of the TFT substrate 100 or the counter substrate 200 constituting the transparent display, light from the LED 40 can be confined inside, so that more light can be supplied to the display area 10, and a brighter screen can be formed.

Figure 22:
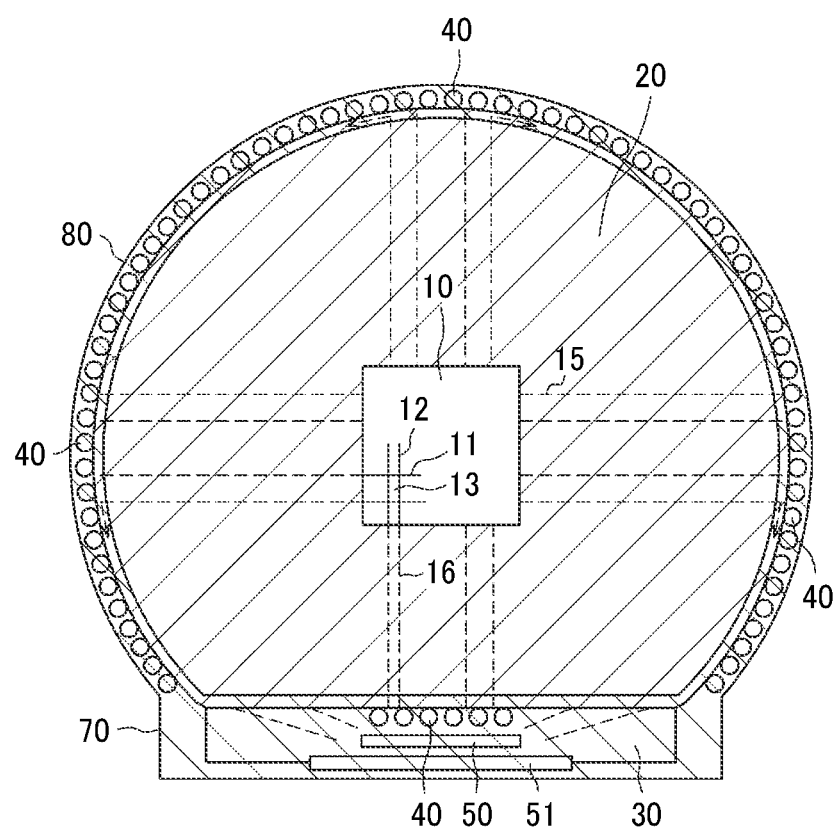
FIG. 22 is a front view of yet another example of the second example of Embodiment 3.

FIG. 22 is a modification of FIG. 21A FIG. 22 differs from FIG. 21A in the arrangement of the scanning line lead wire 15 and the video signal line lead wire 16. In FIG. 22, the scanning line lead wire 15 and the video signal line lead wire 16 extend linearly up to the periphery of the transparent display, and in a portion where the transparent display is covered by the outer frame 80, they extend in the direction of the pedestal 70 in which the driver IC 50 and the like exist. Therefore, in the periphery of the transparent display, the wiring becomes dense, but this portion is covered by the outer frame 80, so that it does not affect the quality as a transparent display.

In FIG. 22, since the wiring density of the scanning line lead wire 15 and the video signal line lead wire 16 in the seal area 20 can be reduced, the transparency of the seal area 20 can be further increased. In other words, in second example, since the TFT substrate 100 and the counter substrate 200, which are the same material, are formed up to the periphery, it is possible to adopt various wiring shapes for the scanning line lead wire 15 and the video signal line lead wire 16 as described in Embodiment 2.

Figure 23:
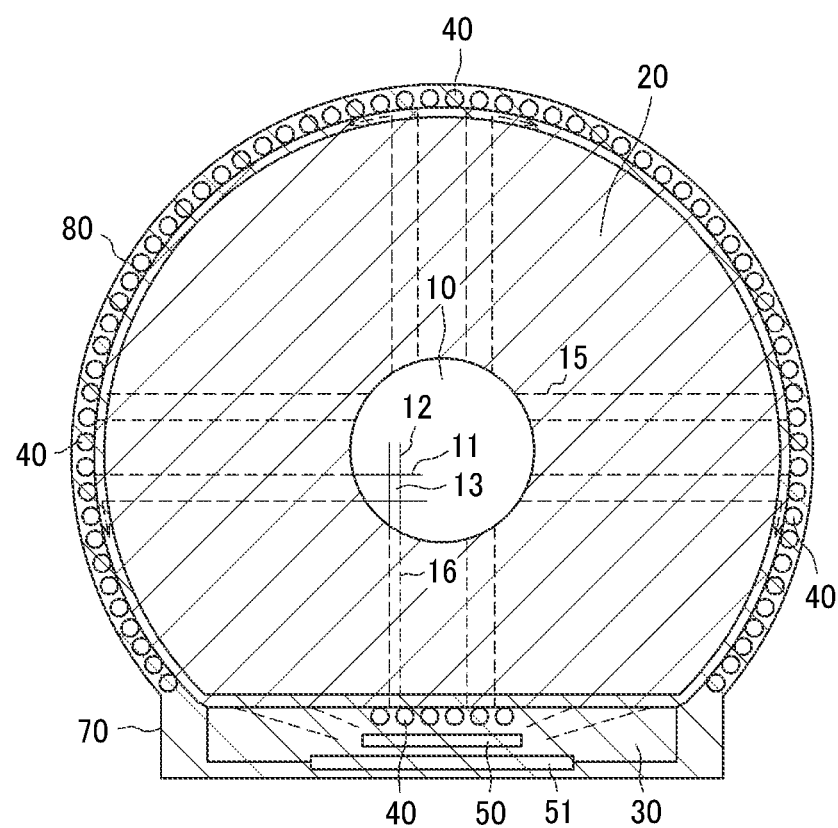
FIG. 23 is a front view of yet another example of the second example of Embodiment 3.

FIG. 23 is yet another example of the present Embodiment. In FIG. 23, the display area 10 is circular. FIG. 23 is the same as FIG. 22 except that the display area 10 is circular. Also, the wiring shapes of the scanning line lead wire 15 and the video signal line lead wire 16 may be various shapes as described in Embodiment 2.

FIGS. 24A and 24B show examples of other shapes of the TFT substrate 100 and the counter substrate 200 of the present example. In the form of the transparent display of FIGS. 21A to 23, in particular, the TFT substrate 100 has a shape which deviates greatly from a circle in the terminal region. It may be difficult to form such a shape of the TFT substrate 100 with glass. In FIG. 24A, both of the TFT substrate 100 and the counter substrate 200 have a circular shape and a straight line. With such a shape, it is easy to form the TFT substrate 100 and the counter substrate 200 using glass. FIG. 24B is a cross-sectional view of FIG. 24A.

In FIG. 24A, a display area 10 is formed substantially in the center of the transparent display. Although the planar shape of the terminal region 30 has a shape slightly shifted from the rectangular shape, since the width tw of the terminal region 30 is small, the layout of the wiring and the like to fit to this shape of the terminal region is possible.

Embodiment 4

Figure 25A:
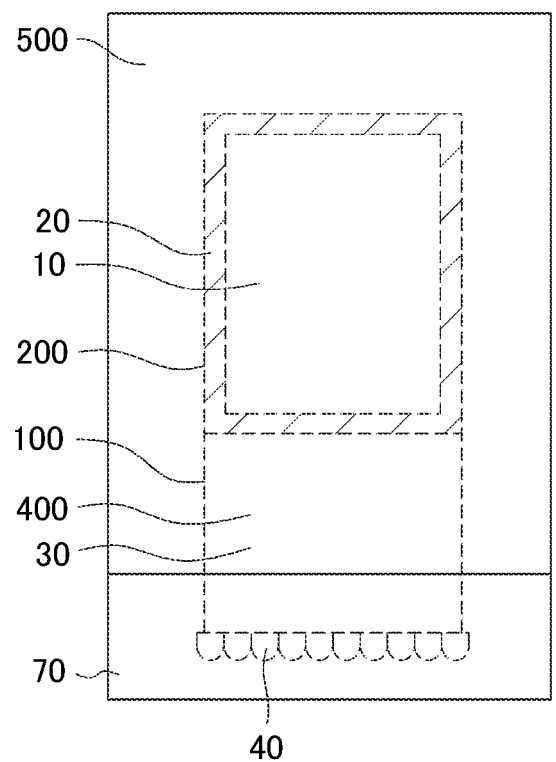
FIG. 25A is a front view showing the structure of Embodiment 4.
Figure 25B:
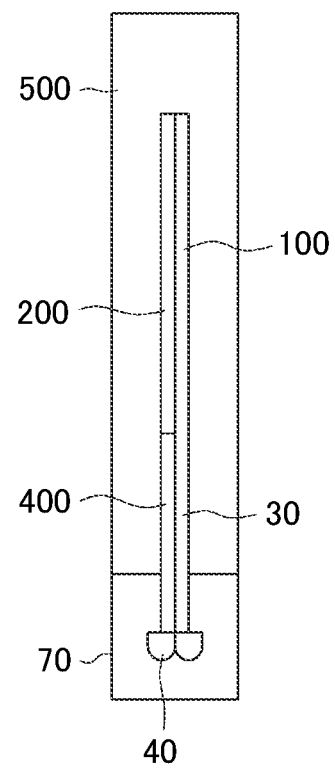
FIG. 25B is a cross sectional view of FIG. 25A.

In Embodiment 4, the terminal region 30 is widened in a transparent display which constitutes a display device in which a screen appears floating in a transparent medium. FIG. 25A is a front view showing a basic configuration of such a transparent display, and FIG. 25B is a cross-sectional view of FIG. 25A. The operation of the liquid crystal display device is similar to that described with reference to FIG. 2 and the like.

In FIG. 25A, a display area 10 is formed at a portion where the TFT substrate 100 and the counter substrate 200 overlap. The TFT substrate 100 and the counter substrate 200 are bonded by a transparent sealant 21 formed in the seal area 20. Liquid crystal is sandwiched between the TFT substrate 100 and the counter substrate 200. In FIG. 25A, a terminal region 30 formed of a TFT substrate 100 extends to a pedestal 70. A scanning line lead wire 15, a video signal line lead wire 16, and the like extend in the terminal region 30. A flexible wiring substrate 51 or the like is connected to an end portion of the terminal region 30, and is omitted in FIG. 25A and the like.

At an end of the terminal region 30, a plurality of LEDs 40 are arranged to supply light to the display area 10. As shown in FIG. 25B, the terminal region 30 is covered with the inner housing 400 from an end of the terminal region 30 in the pedestal 70 to an end of the counter substrate 200. For example, the inner housing 400 is attached to the terminal region 30 by a transparent adhesive material. The inner housing 400 serves as a light guide. If the refractive index of the inner housing 400 is larger than that of the TFT substrate 100, the efficiency of the light guide is high.

An outer housing 500 is formed to sandwich the TFT substrate 100, the counter substrate 200, and the inner housing 400 thereinside. The outer housing 500 is required for design, and is not necessarily required in this Embodiment if the mechanical strength of the transparent display is enough. When the refractive index of the outer housing 500 is made smaller than that of the inner housing 400, light from the LED 40 can be supplied to the display area 10 more efficiently through the inner housing 400. In the configuration of FIG. 25A and FIG. 25B, a transparent display including a TFT substrate 100, a counter substrate 200, an inner housing 400, and the like is inserted into a recess space formed in an outer housing 500. In this case, it is possible to eliminate a gap between the recessed portion of the outer housing 500 and the transparent display by bonding the transparent display and the outer housing 500 using a transparent adhesive.

In the configuration of FIG. 25A and FIG. 25B, the outer shape of the display device can be changed optionally by changing the outer shape of the outer casing 500. That is, the request on the design to a display device can be satisfied easily.

FIG. 26A shows an example in which an outer shape of the outer housing 500 is circular and a periphery of the outer housing 500 is covered with an outer frame 80. FIG. 26A also shows an example in which the terminal region 30 extends from the display area 10 to the pedestal 70, thereby realizing a transparent display in which the screen looks like floating in the air. A light guide 450 is present in the outer frame 80, and light from the LED 40 is supplied from the entire periphery of the display area 10 via the light guide 450. In the terminal region 30, a scanning line lead wire 15 and a video signal line lead wire 16 extend from the display area 10 toward the pedestal 70. Hereinafter, in this Embodiment, the scanning line lead wire 15 and the video signal line lead wire 16 may be collectively referred to as a lead-out wiring 17.

FIG. 26B is a cross-sectional view taken along line E-E of FIG. 26A. In FIG. 26B, a display area 10 is formed at a portion where the TFT substrate 100 and the counter substrate 200 overlap, and the terminal region 30 extends to the pedestal 70. In the terminal region 30, a scanning line lead wire 15, a video signal line lead wire 16, and the like are formed, and an antireflection film 90 is formed covering the terminal region 30 in order to prevent reflection from these lines. An inner housing 400 is disposed so as to cover the antireflection film 90. The TFT substrate 100, the counter substrate 200, the inner housing 400, and the like are housed in the outer housing 500.

In FIG. 26B, a light guide 450 is disposed on one end side of the outer housing 500, and a reflective film 60 is formed on the outside of the outer housing. An outer frame 80 covers an end part of an outer housing 500, a light guide 450, and a reflection film 60. Light transmitted from the LED 40, disposed on the side of the pedestal 70, is radiated toward the display area 10 through the light guide 450. A reflective film 60 covering the periphery of the light guide 450 prevents light from the LED 40 from being radiated to the outside from the side surface of the outer housing 500.

Figure 27B:
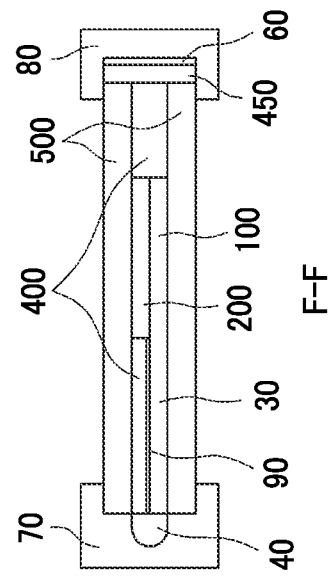
FIG. 27B is a cross sectional view of FIG. 27A along the line F-F.
Figure 27A:
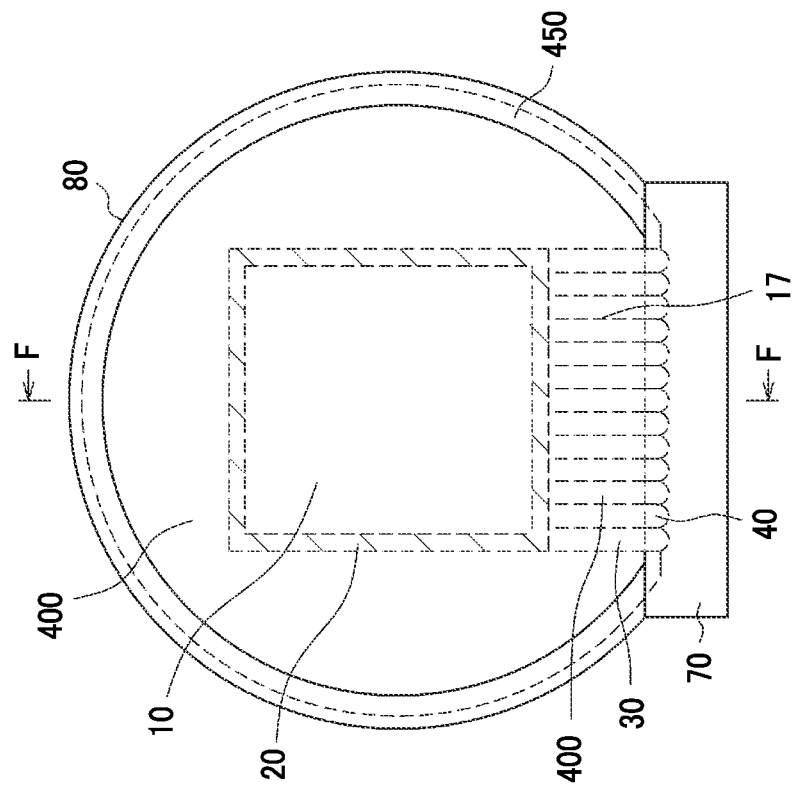
FIG. 27A is a front view showing a variation of F 26A.

FIGS. 27A and 27B are variations of FIGS. 26A and 26B. The feature of FIGS. 27A and 27B is that a transparent display formed of a TFT substrate 100, a counter substrate 200, an inner housing 400, and the like is sandwiched by an outer housing 500. The plate-shaped outer housing 500 can be attached to the TFT substrate 100, the counter substrate 200, the inner housing 400, and the like by a transparent adhesive material. In the configuration of FIG. 27A and FIG. 27B, it is possible to improve the processing cost and the material yield of the outer housing 500 in that the outer housing 500 having a plate shape can be used.

Figure 28B:
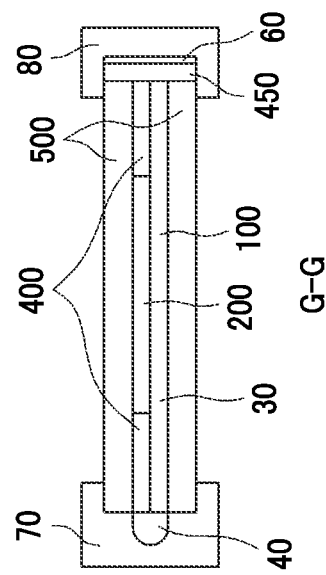
FIG. 28B is a cross sectional view of FIG. 28 A along the line G-G.
Figure 28A:
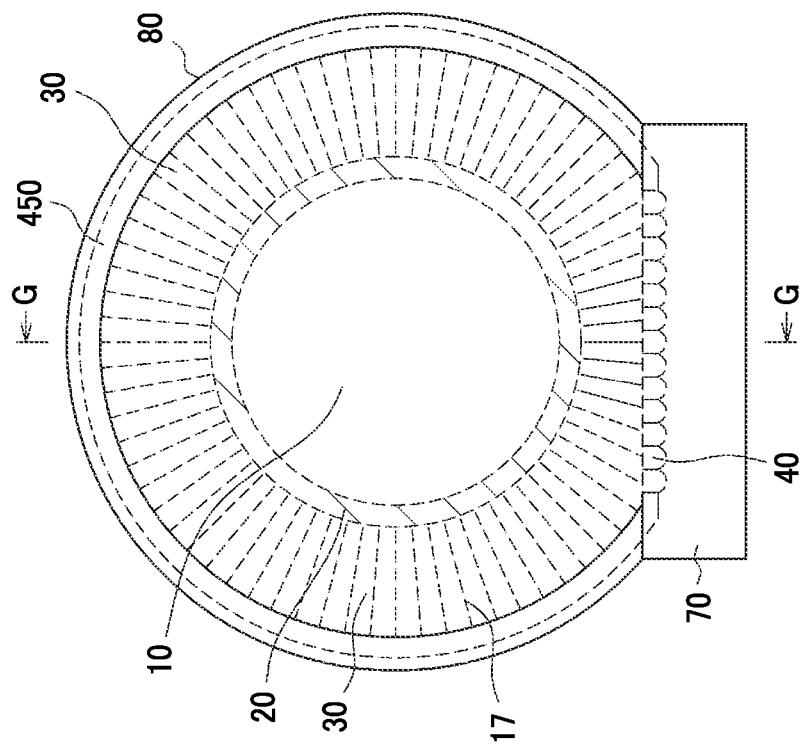
FIG. 28A is a front view of the structure in which the display area is made circle, and the lead-out wirings are disposed radially in Embodiment 4.

FIGS. 28A and 28B show an example in which the outer shape of the TFT substrate 100 and the counter substrate 200 constituting the transparent display is circular. In FIG. 28A, the display area 10 is circular. The counter substrate 200 and the TFT substrate 100 are concentrically arranged, and a display area 10 is formed at a portion where the counter substrate 200 and the TFT substrate 100 overlap each other. A portion of the TFT substrates 100 which does not overlap the counter substrate 200 constitutes a terminal region 30, and an end portion of the TFT substrate 100 is surrounded by an outer frame 80.

The lead-out wirings 17 are radially formed from a display area 10 toward an end part of a TFT substrate 100; the lead-out wirings 17 are bundled at the area in which the terminal region 30 is covered by the outer frame 80, and extend toward the pedestal 70. Therefore, in this portion, although the density of the lead wires is increased, the quality of the transparent display is not degraded because the portion is covered with the outer frame 80.

In the configuration of FIG. 28A, since the lead-out wirings 17 are formed radially in a wide terminal region, the wiring density can be reduced and the transparency of the terminal region 30 can be increased. Further, since the lead-out wirings 17 are formed radially, it is possible to make uniform the length of each wiring in the seal area 20, so that it is relatively easy to make the wiring resistance in the terminal region 30 uniform.

FIG. 28B is a cross-sectional view taken along line G-G of FIG. 28A. In FIG. 28B, an inner housing 400 is disposed in a terminal region 30 formed outside of the counter substrate 200. The TFT substrate 100, the counter substrate 200, and the inner housing 400 are sandwiched by the outer housings 500. Other configurations are similar to those described in FIG. 27B.

Figure 29A:
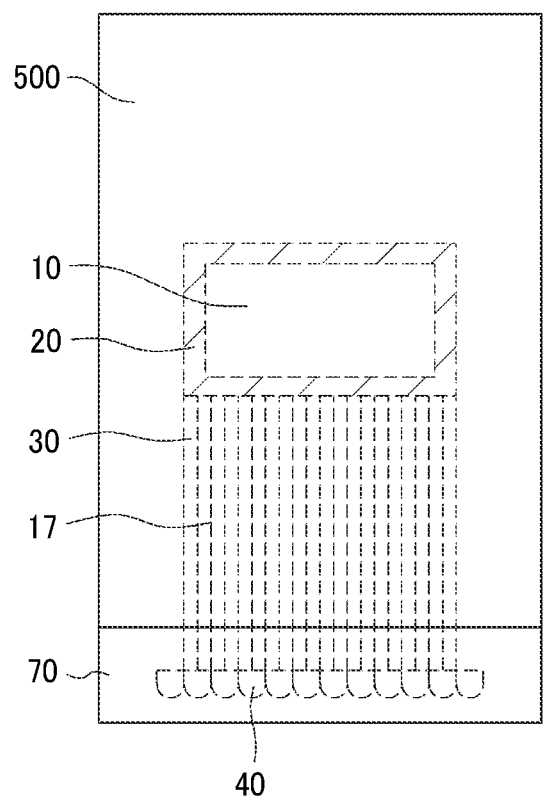
FIG. 29A is a front view of the structure in which the display area is a laterally elongated rectangle in Embodiment 4.
Figure 29B:
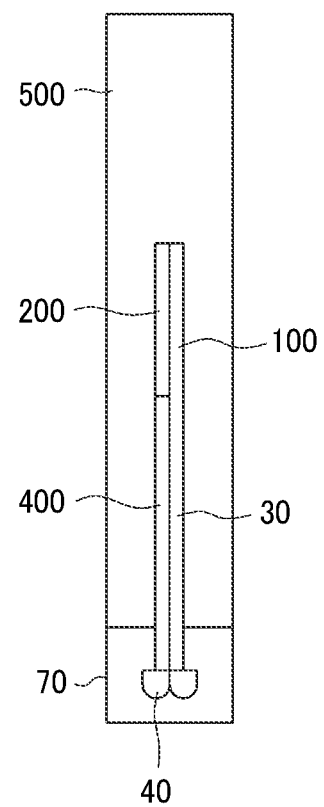
FIG. 29B is a cross sectional view of FIG. 29A.

FIG. 29A shows an example in which the display area 10 is formed into a horizontally long rectangle. In this case, since the width of the terminal region 30 in which the lead-out wiring 17 is formed can be increased, the density of the lead-out wiring 17 can be reduced, and consequently a decrease in the light transmittance of the terminal region 30 can be reduced. FIG. 29B is a cross-sectional view of FIG. 29A. FIGS. 29A and 29B are the same as FIGS. 25A and 25B, except that the display area 10 is laterally elongated and the density of the lead-out wiring 17 is reduced.

FIG. 30A shows a case where the display area 10 is formed into a vertically elongated rectangle, and a support 81 is formed for the transparent display. Whether or not the support 81 is formed will be determined by design requirements, but will be described below on the assumption that the support 81 can be formed. In such a case, by arranging the terminal region 30 and the lead-out wirings 17 in the direction of the long side of the display area 10, the density of the lead-out wiring 17 can be reduced, and the decrease in the transparency of the terminal region 30 can be prevented.

An inner housing 400 is disposed in an area from the TFT substrate 100 and the counter substrate 200 to the end of the display device. Although not explicitly shown in FIG. 30A, an inner housing 400 is also formed on the terminal region 30. FIG. 30B is a cross-sectional view of FIG. 30A. As shown in FIG. 30B, the transparent display formed of the TFT substrate 100, the counter substrate 200, and the like and the inner housing 400 are sandwiched by the outer housing 500. By making the refractive index of the inner housing 400 larger than that of the outer housing 500, light from the LED 40 can be more efficiently guided to the display area 10.

FIG. 31A shows an example in which the display area 10 is long in longitudinal direction and the periphery of the transparent display is covered with the outer frame 80. Whether the display area 10 is vertically elongated or the outer frame 80 is formed will be determined by a design request, however the explanation is made on the premise of such a configuration in this example. FIG. 31A is a front view of a display device. The terminal region 30 of the transparent display is formed on the upper and lower sides of the display area 10. With this configuration, the density of the lead-out wiring 17 can be reduced, and the decrease in the transparency in the terminal region 30 can be suppressed, and the quality as a transparent display can be maintained.

In FIG. 31A, the lead-out wirings 17 extending upward is gathered in a portion covered by the peripheral outer frame 80, and can be extended toward the pedestal 70 via a flexible wiring substrate, for example. Alternatively, as described in FIG. 15A and the like of Embodiment 2, a driver IC 50 may be disposed on the upper side of FIG. 31A to reduce the number of wirings, and the reduced wirings extend toward the side of the pedestal 70.

Incidentally, the overall outline of the display device is larger than that of the transparent display device. An inner housing 400 is formed between the transparent display and the outer shape of the display device. The LEDs 40 are disposed at an end of the inner housing 400. Since there is no lead-out wiring 17 between the LEDs 40 and the display area 10, flickering or the like due to reflection of light from the LEDs 40 by the lead-out wiring 17 can be reduced.

FIG. 31B is a cross-sectional view of FIG. 31A. In FIG. 31B, a display area 10 is formed at a portion where a counter substrate 200 and a TFT substrate 100 overlap, and a terminal region 30, in which the TFT substrates 100 does not overlap the counter substrate 200, is formed on the upper and lower sides of the counter substrate 200; the terminal regions extend to the end of the transparent display. The terminal region 30 is covered with an inner housing 400. The counter substrate 200, the TFT substrate 100, and the inner housing 400 are sandwiched by the outer housing 500. When the refractive index of the inner housing 400 is made larger than that of the outer housing 500, light from the LED 40 can be more efficiently guided to the display area 10.

FIG. 32A shows an example in which the outline of the display device is circular. In FIG. 32A, a display area 10 is formed at a portion where the TFT substrate 100 and the counter substrate 200 overlap, and the terminal regions 30 extend to the left side and right side of the display area 10. Since the lead-out wirings 17 are arranged on the left and right sides of the display area 10, the density of the drawing wirings 17 can be reduced, and the decrease in the transparency in the terminal region 30 can be reduced.

Since the transparent display itself has a shape close to a rectangle, the inner housing 400 is formed along the long side of the transparent display in order to make the outer shape of the display device circular. The LEDs 40 are arranged on a side surface of an edge of the inner housing 400, and light from an LED 40 is guided to a display area 10 by an inner housing 400.

In FIG. 32A, the lead-out wirings 17 extending in the lateral direction are combined in the portion covered by the outer frame 80 in the periphery, and can be extended toward the pedestal 70 via, for example, a flexible wiring substrate or the like. Alternatively, as illustrated in FIG. 15A and the like of Embodiment 2, a driver IC 50 may be disposed in a portion hidden in the outer frame 80 in the lateral direction of FIG. 32A to reduce the number of wirings and the wirings of reduced number may be extended to the side of the pedestal 70.

FIG. 32B is a side view of FIG. 32A In the side view, only the pedestal 70 and the outer frame 80 are visible. FIG. 32C is a cross-sectional view of FIG. 32A in which the outer frame 80 is removed. In FIG. 32C, the TFT substrate 100, the counter substrate 200, and the inner housing 400 are sandwiched by the outer housing 500. By making the refractive index of the inner housing 400 larger than that of the outer housing 500, light from the LED 40 can be efficiently guided to the display area 10.

FIG. 33 is a sectional view showing another configuration of the present Embodiment. In FIG. 33, a display area 10 is formed at a portion where the counter substrate 200 and the TFT substrate 100 overlap. A portion the TFT substrates 100, which does not overlap the counter substrate 200, constitutes a terminal region 30 and extends toward the pedestal 70. An antireflection film 90 is formed on the lead-out wirings formed in the terminal region 30. The terminal region 30 is connected to a flexible wiring substrate 51 at an end thereof. The flexible wiring substrate 51 is further connected to a printed circuit board 53. A driver IC 50 is mounted on the flexible wiring substrate 51.

An LED 40 is disposed on the flexible wiring substrate 51. However, the LED 40 is electrically connected to the LED flexible wiring substrate 52.

The LED 40 and the LED flexible wiring substrate 52 are also disposed at an end of the transparent substrate opposite to the pedestal 70. A feature of FIG. 33 is that a transparent gel-like inner housing 400 is formed covering a TFT substrate 100, a counter substrate 200, a part of an LED 40, and the like. Such a transparent gel may be formed of, for example, a silicone resin.

By covering the transparent display with transparent gel 400, it is possible to cover the components on the transparent display without gaps. Further, even in the range covered by the pedestal 70 or the outer frame 80, the optical coupling can be improved by eliminating gaps by covering the LEDs 40 and the like with the transparent gel 400. Consequently, the degree of freedom in layout can be improved.

FIG. 34 is a sectional view showing still another Embodiment of the present invention. An LED 40 used as a light source becomes high temperature. Further, a driver IC 50 is disposed inside the pedestal 70, however, the driver IC 50 also becomes high in temperature. In FIG. 34, the heat pipe 55 is disposed in proximity to the LED 40 and the driver IC 50 so as to dissipate the heat of the LED 40 and the driver IC 50.

Another feature of FIG. 34 is that a partial hot spot is eliminated by slightly separating the driver IC 50 from the LED 40 and placing the LED 40 and the driver IC 50 on opposite sides of the heat pipe 55. Other configurations of FIG. 34 are the same as those of FIG. 33.

FIG. 35A is a front view showing a display device using a heat pipe 55. The configuration of the transparent display in FIG. 35A is similar to that described in FIG. 31A. In other words, the LED 40 as a light source is arranged in the lateral direction of the transparent display, and light from the LED 40 is incident to the display area 10 via the inner housing 400. Electric power is supplied to the LED 40 via the LED flexible wiring substrate 52. In FIG. 35A, a heat pipe 55 is disposed outside the flexible wiring substrate 52 for the LEDs to dissipate heat generated in the LEDs 40 to the outside. The heat pipe 55 is covered by an outer frame 80.

FIG. 35B is a side view of FIG. 35A. The heat pipe 55 is covered by an outer frame 80. FIG. 35C is a side view of the transparent display in which the outer frame 80 and the heat pipe 55 are removed. The LEDs 40 are arranged on the side of the transparent display. Therefore, although the side on which the LEDs 40 are disposed becomes a high temperature, as shown in FIG. 35A, the heat generated is radiated to the outside by the heat pipe 55.

FIG. 36A is a front view showing an example of another transparent display using a heat pipe 55. The configuration of FIG. 36A is the same as FIG. 32A, except that a heat pipe 55 is present. In FIG. 36A, a flexible wiring substrate 52 for the LEDs 40 is disposed outside of the LEDs 40, and a heat pipe 55 surrounds the flexible wiring substrate 52. In FIG. 36A, the pedestal 70 and the outer frame 80 are omitted.

FIG. 36B is a side view of the transparent display corresponding to FIG. 36A, in which a pedestal 70 and an outer frame 80 exist. By using a metal such as copper, which has good heat conduction, in the outer frame 80, it can be used as a heat radiating means for assisting the heat pipe 55. FIG. 36C is a cross-sectional view corresponding to the transparent display of FIG. 36A in which the outer frame 80 and heat pipe 55 are omitted. FIG. 36C is a configuration similar to that described in FIG. 32C.

FIG. 37A is a front view showing yet another example of the present invention. FIG. 37A omits the pedestal 70 and the outer frame 80. The configuration of the transparent display of FIG. 37A is the same as in FIG. 36 A. However, it is different from FIG. 36A in that the LEDs 40 are disposed only on the lower side of the transparent display corresponding to the pedestal side. In FIG. 37A, a light guide 450 is disposed at an end portion of the inner housing 400 and the TFT substrate 100 other than the side in which LEDs 40 are disposed; the light from the LED 40 is led to the periphery of the transparent display, and light from the LED 40 can be supplied from the periphery to the display area 10. Thus, the luminance of the display area is improved and the luminance distribution in the display area 10 can be made uniform. In FIG. 37A, a reflection sheet 65 is formed on the outside of the light guide 450, and a flexible wiring substrate 52 for the LEDs is disposed on the outside of the LEDs 40.

In FIG. 37A, a heat pipe 55 is disposed outside the LED flexible wiring substrate 52 and the reflective sheet 65. Heat generated in the LEDs 40 is dispersed throughout the display device by the heat pipe 55. FIG. 37B is a side view of the transparent display when the pedestal 70 and the outer frame 80 are disposed. The outer frame 80 can be used as a heat radiating means for assisting the heat pipe 55 by adopting a metal having good heat conductivity as cupper.

FIG. 37C is a cross-sectional view of the transparent display shown in FIG. 37A in which the outer frame 80 is omitted. FIG. 37C differs from FIG. 36C in that, instead of LEDs 40, the light guide 450 and the reflection sheet 65 are disposed on the side surfaces of the end portion of the inner housing 400 and the outer housing 500 opposite to the pedestal 70.

According to this Embodiment, by extending the TFT substrate on which the terminal region is formed to the inside of the pedestal or the inside of the outer frame 80, it is possible to realize a transparent display in which an image is viewed as floating in the air, while making the wiring inconspicuous. In addition, a transparent display can be realized without using an expensive transparent flexible wiring substrate.

In the foregoing Embodiments, the transparent display has been described as being planar. However, the present invention is applicable even when the transparent display is curved. In other words, since light from the LED travels to the display area while reflecting at the interface of the TFT substrate, the counter substrate, or the inner housing, light can be supplied from the LEDs disposed on the side of the transparent display even when the transparent display is curved.

In the above Embodiments, an example in which a liquid crystal display device is used as a transparent display has been described. However, the contents of the above Embodiment can be used for other display devices such as an organic EL display device and a micro LED display device. Further, since the organic EL display device and the micro ELD display device are self-luminous, a backlight as a light source is not required. Therefore, when a self-luminous display device is used, the configuration of the transparent display can be realized with a simpler configuration than in the case of a liquid crystal display device.

What is claimed is:

1. A display device comprising a transparent display device being fixed in a pedestal,
   the transparent display device having a display area and a first transparent medium,
   the first transparent medium existing between the display area and the pedestal,
   wherein scanning lines and video signal lines are formed in the display area,
   scanning line lead wires and video signal lead wires are formed in the first transparent medium, and
   provided an area of the display area is S1, and an area of the first transparent medium is S2,
   S2/S1 is 0.5 or more.

2. The display device according to claim 1, wherein S 2/S 1 is equal to or greater than 1.

3. The display device according to claim 1, wherein S 2/S 1 is equal to or greater than 2.

4. The display device according to claim 1, wherein the display area is surrounded by the first transparent medium.

5. The display device according to claim 1, wherein the transparent display device is sandwiched by a second transparent medium.

6. The display device according to claim 1, wherein the display device has an outer frame, and a second transparent medium is formed between the outer frame and the transparent display device.

7. The display device according to claim 6, wherein the transparent display device and the second transparent medium are sandwiched by a third transparent medium.

8. The display device according to claim 1, wherein the scanning lines and the video signal lines are formed in the display area,
   the scanning line lead wires and the video signal lead wires are formed in the transparent medium,
   a pitch between the scanning line lead wires is the same or larger than a pitch between the scanning lines, and
   a pitch between the video signal line lead wires is the same or larger than a pitch between the video signal lines.

9. The display device according to claim 4,
   wherein the scanning lines extend in a first direction,
   the video signal lines extend in a second direction,
   the scanning line lead wires extend in the first direction and in a direction opposite to the first direction in the first transparent medium, and
   a pitch between the scanning line lead wires is the same or larger than a pitch between the scanning lines.

10. The display device according to claim 4,
    wherein the scanning lines extend in a first direction,
    the video signal lines extend in a second direction,
    the video signal line lead wires extend in the second direction and in a direction opposite to the second direction in the first transparent medium, and
    a pitch between the video signal line lead wires is the same or larger than a pitch between the video signal lines.

11. The display device according to claim 1,
wherein the transparent display device is a liquid crystal display device,
the display area is constituted from a liquid crystal layer sandwiched between a TFT substrate and a counter substrate,
the first transparent medium is constituted from a transparent sealant existing between the TFT substrate and the counter substrate, and
an LED is disposed at the edge of the first transparent medium in the pedestal.

12. The display device according to claim 1,
wherein the transparent display device is an organic EL display device.

13. The display device according to claim 1,
wherein the transparent display device is a micro LED display device.

14. A display device comprising a transparent display device being fixed in a pedestal,
wherein the transparent display device is a liquid crystal display device having a display area and a first transparent medium, the first transparent medium is present between the display area and the pedestal,
the display area is constituted from a liquid crystal layer sandwiched between a TFT substrate and a counter substrate, and scanning lines and video signal lines are formed on the TFT substrate,
the first transparent medium is constituted from a terminal area in which scanning line lead wirings and video signal line lead wirings are formed on the TFT substrate,
a second transparent medium is formed on the terminal area,
LEDs are disposed at an edge of the first transparent medium or an edge of the second transparent medium, and
provided an area of the display area is S1, and an area of the transparent medium is S2,
S2/S1 is 0.5 or more.

15. The display device according to claim 14,
wherein, given an area of the display area is S1, and an area of the transparent medium is S2,
S2/S1 is 0.5 or more.

16. The display device according to claim 14,
wherein the display area is surrounded by the first transparent medium.

17. The display device according to claim 14,
wherein the display device has an outer frame, and the second transparent medium is formed between the outer frame and the transparent display device.

18. The display device according to claim 14,
wherein the transparent display device and the second transparent medium are sandwiched by a third transparent medium.

19. The display device according to claim 14,
wherein the scanning lines and the video signal lines exist in the display area,
the scanning line lead wires and the video signal line lead wires exist in the first transparent medium,
a pitch of the scanning line lead wires is equal to or larger than a pitch of the scanning lines, and
a pitch of the video signal line lead wires is equal to or larger than a pitch of the video signal lines.

20. The display device according to claim 14,
wherein the scanning lines extend in a first direction and the video signal lines extend in a second direction,
the scanning line lead wires extend both in a first direction and in a direction opposite to the first direction,
the video signal line lead wires extend both in a second direction and in a direction opposite to the second direction,
a pitch of the scanning line lead wires is equal to or larger than a pitch of the scanning lines, and
a pitch of the video signal line lead wires is equal to or larger than a pitch of the video signal lines.

* * * * *